(12) United States Patent
Yeh

(10) Patent No.: US 10,312,263 B2
(45) Date of Patent: Jun. 4, 2019

(54) DISPLAY PANEL AND MANUFACTURING METHOD THEREOF

(71) Applicant: HannStar Display Corporation, Taipei (TW)

(72) Inventor: Cheng-Yen Yeh, Taichung (TW)

(73) Assignee: HannStar Display Corporation, Taipei (TW)

( * ) Notice: Subject to any disclaimer, the term of this patent is extended or adjusted under 35 U.S.C. 154(b) by 0 days.

(21) Appl. No.: 15/628,664

(22) Filed: Jun. 21, 2017

(65) Prior Publication Data

US 2018/0108677 A1    Apr. 19, 2018

(30) Foreign Application Priority Data

Oct. 14, 2016    (CN) .......................... 2016 1 0894298

(51) Int. Cl.
| | | |
|---|---|---|
| *H01L 27/146* | (2006.01) | |
| *H01L 21/00* | (2006.01) | |
| *H01L 27/12* | (2006.01) | |

(52) U.S. Cl.
CPC ........ *H01L 27/124* (2013.01); *H01L 27/1262* (2013.01)

(58) Field of Classification Search
CPC .......................... H01L 27/3276; H01L 27/124
USPC ........................ 438/34, 73; 257/88, 258, 443
See application file for complete search history.

(56) References Cited

U.S. PATENT DOCUMENTS

| | | | | |
|---|---|---|---|---|
| 8,363,192 B2* | 1/2013 | Takahashi | ......... | G02F 1/136286 349/139 |
| 9,247,615 B2* | 1/2016 | Chang | .................... | H05B 37/00 345/102 |
| 9,569,993 B2* | 2/2017 | Wu | .......................... | G09G 3/20 345/103 |
| 9,837,022 B2* | 12/2017 | Lee | ..................... | G02F 1/13454 345/55 |
| 10,032,801 B2* | 7/2018 | Katsuta | .......................... | 349/43 |
| 2016/0217740 A1* | 7/2016 | Lee | ..................... | G09G 3/3258 |

* cited by examiner

*Primary Examiner* — Calvin Lee
(74) *Attorney, Agent, or Firm* — CKC & Partners Co., LLC

(57) ABSTRACT

The display panel includes a first substrate, first signal lines, second signal lines, third signal lines, thin film transistors, pixel electrodes, and at least one driving circuit. The first signal lines respectively intersect with the second signal lines to define multiple pixel regions. At least one of the pixel regions has one of the third signal lines diposed therein. The second signal lines and the third signal lines are electrically connected to the at least one driving circuit. Each of the first signal lines is electrically connected to one of the gate and the source of at least one of the thin film transistors. Each of the second signal lines is electrically connected to the other one of the gate and the source of at least one of the thin film transistors. Each of the third signal lines is electrically connected to one of the first signal lines.

16 Claims, 35 Drawing Sheets

DISPLAY PANEL AND MANUFACTURING METHOD THEREOF

RELATED APPLICATIONS

This application claims priority to China Application Serial Number 201610894298.4 filed Oct. 14, 2016, which is herein incorporated by reference.

BACKGROUND

Field of Invention

The present invention relates to a display panel. More particularly, the present invention relates to a display panel with narrow border and a manufacturing method thereof.

Description of Related Art

A typical display device has a display area and a non-display area. Pixel structures, gate lines and data lines are disposed in the display area. The gate lines and the data lines extend toward the non-display area for electrically connecting to a driving circuit. FIG. 1 is a top view of a conventional display. Referring to FIG. 1, the display panel has a display area AA and a non-display area NA. Multiple pixel structures P are disposed in the display area AA, and are arranged as pixels rows and pixel columns. Gate lines GL(1)-GL(m) and data lines DL(1)-DL(n) are disposed in the display area AA. The gate lines GL(1)-GL(m) and the data lines DL(1)-DL(n) are respectively electrically connected to the pixel structures P in the pixel columns. A driving circuit DC is disposed in the non-display area NA. The gate lines GL(1)-GL(m) extend toward the area of the driving circuit DC for electrically connecting to the driving circuit DC. Similarly, the data lines DL(1)-DL(n) in the display area AA extend toward the area of the driving circuit DC for electrically connecting to the driving circuit DC. As shown in FIG. 1, the gate lines GL(1)-GL(m) respectively extend toward the non-display area NA located at two opposite sides of the display panel and then concentrate toward the area of the driving circuit DC for electrically connecting to the driving circuit DC. Therefore, the size of the border of the display panel is limited by the number of the gate lines GL(1)-GL(m) and the layout, and cannot be reduced. In addition, there are more and more gate lines and data lines when the resolution of the display device gets larger so that the gate lines and the data lines occupy large area of the non-display area. Furthermore, the demanding for narrow border is increasing in the market. Therefore, it is an issue in the art to meet the demanding of narrow border or to even reduce the width of the border while the resolution is increasing.

SUMMARY

An objective of the invention is to provide a display panel with narrow border.

Embodiments of the present invention provide a display panel having a display area and a non-display area. The display panel includes a first substrate, first signal lines, second signal lines, third signal lines, thin film transistors, pixel electrodes, and at least one driving circuit. The first signal lines, the second signal lines and the third signal lines are disposed on the first substrate. The first signal lines respectively intersect with the second signal lines to define multiple pixel regions. At least one of the pixel regions has one of the third signal lines disposed therein. The thin film transistors and the pixel electrodes are disposed in the pixel regions. Each of the thin film transistors includes a gate, a source and a drain which is electrically connected to one of the pixel electrodes. The second signal lines and the third signal lines are electrically connected to the at least one driving circuit. Each of the first signal lines is electrically connected to one of the gate and the source of at least one of the thin film transistors. Each of the second signal lines is electrically connected to the other one of the gate and the source of at least one of the thin film transistors. Each of the third signal lines is electrically connected to one of the first signal lines.

In some embodiments, the first signal lines are gate lines and are formed in a first metal layer. The second signal lines are data lines and are formed in a second metal layer in the display area. The third signal lines are formed in the second metal layer in the display area.

In some embodiments, an insulation layer is formed between the first metal layer and the second metal layer. The insulation layer has multiple vias. Each of the third signal lines is electrically connected to one of the first signal lines through at least one of the vias.

In some embodiments, the first signal lines are data lines and are formed in a second metal layer. The second signal lines are gate lines and are formed in a first metal layer in the display area. The third signal lines are formed in the first metal layer in the display area.

In some embodiments, an insulation layer is formed between the first metal layer and the second metal layer. The insulation layer has multiple vias, and each of the third signal lines is electrically connected to one of the first signal lines through at least one of the vias.

In some embodiments, the display panel further includes a transparent conductive layer disposed between the third signal lines and the pixel electrodes, and the transparent conductive layer covers at least part of the third signal lines.

In some embodiments, the transparent conductive layer is a common electrode, and each of the pixel electrodes includes multiple slits.

In some embodiments, the display panel further includes a second substrate and another transparent conductive layer. The second substrate and the first substrate are disposed opposite to each other. The another transparent conductive layer is disposed on the second substrate. The another transparent conductive layer is a common electrode.

In some embodiments, each of the first signal lines is electrically connected to at least two of the third signal lines.

In some embodiments, one of the second signal lines and the third signal lines includes a first part and a second part. The first part is formed in the second metal layer, and the second part is formed in the first metal layer. The display panel further includes a connection structure disposed in the non-display area for electrically connecting the first part and the second part. The connection structure includes: a first opening in a first insulation layer disposed on the first metal layer, in which the first opening exposes the second part; a second opening and a third opening in a second insulation layer disposed on the second metal layer, in which the second opening corresponds to the first opening, and the third opening exposes the first part; and a transparent conductive layer connected to the first part through the third opening, and connected to the second part through the second opening.

In some embodiments, one of the second signal lines and the third signal lines includes a first part and a second part, the first part is formed in the second metal layer, and the second part is formed in the first metal layer. The display panel further includes a connection structure disposed in the non-display area for electrically connecting the first part and the second part. The connection structure includes an opening in a first insulation layer disposed on the first metal, in which the opening exposes the second part and the first part is electrically connected to the second part through the opening.

In some embodiments, the at least one driving circuit is disposed on the first substrate and is disposed in the non-display area.

In some embodiments, the at least one driving circuit includes a gate driving circuit and a source driving circuit.

In some embodiments, the at least one driving circuit includes multiple pads which include first pads and second pads. The first pads are electrically connected to the second signal lines respectively. The second pads are electrically connected to the third signal lines respectively.

In some embodiments, the pads are arranged as at least two rows.

In some embodiments, the pixel regions are arranged as columns and rows. Each of the third signal lines extends through at least one pixel region in one of the columns.

In some embodiments, the pixel regions are arranged as columns and rows. The columns include a first column, a second column and a third column which are arranged along a first direction. One of the third signal lines extends through at least one pixel region in the first column. None of the third signal lines extends through the pixel regions in the second column and the third column.

From another aspect, embodiments of the present invention provide a method for manufacturing a display panel. The method includes: forming a first metal layer on a substrate, in which the first metal layer includes multiple first signal lines; forming a first insulation layer on the first metal layer; etching the first insulation layer to form multiple vias in the first insulation layer; and forming a second metal layer on the first insulation layer, in which the second metal layer includes second signal lines and third signal lines, and each of the third signal lines is electrically connected to one of the first signal lines through at least one of the vias.

In some embodiments, the method further includes: forming a second insulation layer, a transparent conductive layer, a third insulation layer and a pixel electrode on the second metal layer sequentially, in which projections of the pixel electrode, the transparent conductive layer and the third signal lines onto the substrate are at least partially overlapped with each other.

From another aspect, embodiments of the invention provide a method for manufacturing a display panel. The method includes: forming a first metal layer on a substrate, in which the first metal layer includes second signal lines and third signal lines; forming a first insulation layer on the first metal layer; etching the first insulation layer to form multiple vias in the first insulation layer; and forming a second metal layer on the first insulation layer, in which the second metal layer includes first signal lines, and one of the first signal lines is electrically connected to at least one of the third signal lines through at least one of the vias.

In the display panel and the method provided in the embodiments, the requirement for narrow border is achieved.

BRIEF DESCRIPTION OF THE DRAWINGS

The invention can be more fully understood by reading the following detailed description of the embodiment, with reference made to the accompanying drawings as follows.

FIG. 26A-33A are top views illustrating intermediate stages of a method for manufacturing the display panel.

FIG. 26B-33B are cross-sectional views illustrating intermediate stages of the method for manufacturing the display panel.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size. The using of "first", "second", "third", etc. in the specification should be understood for identifying units or data described by the same terminology, but are not referred to particular order or sequence. In addition, the term "electrically connected" or "coupled" used in the specification should be understood for electrically connecting two units directly or indirectly. In other words, when "a first object is electrically connected to a second object" is written in the specification, it means another object may be disposed between the first object and the second object.

Figure 1:
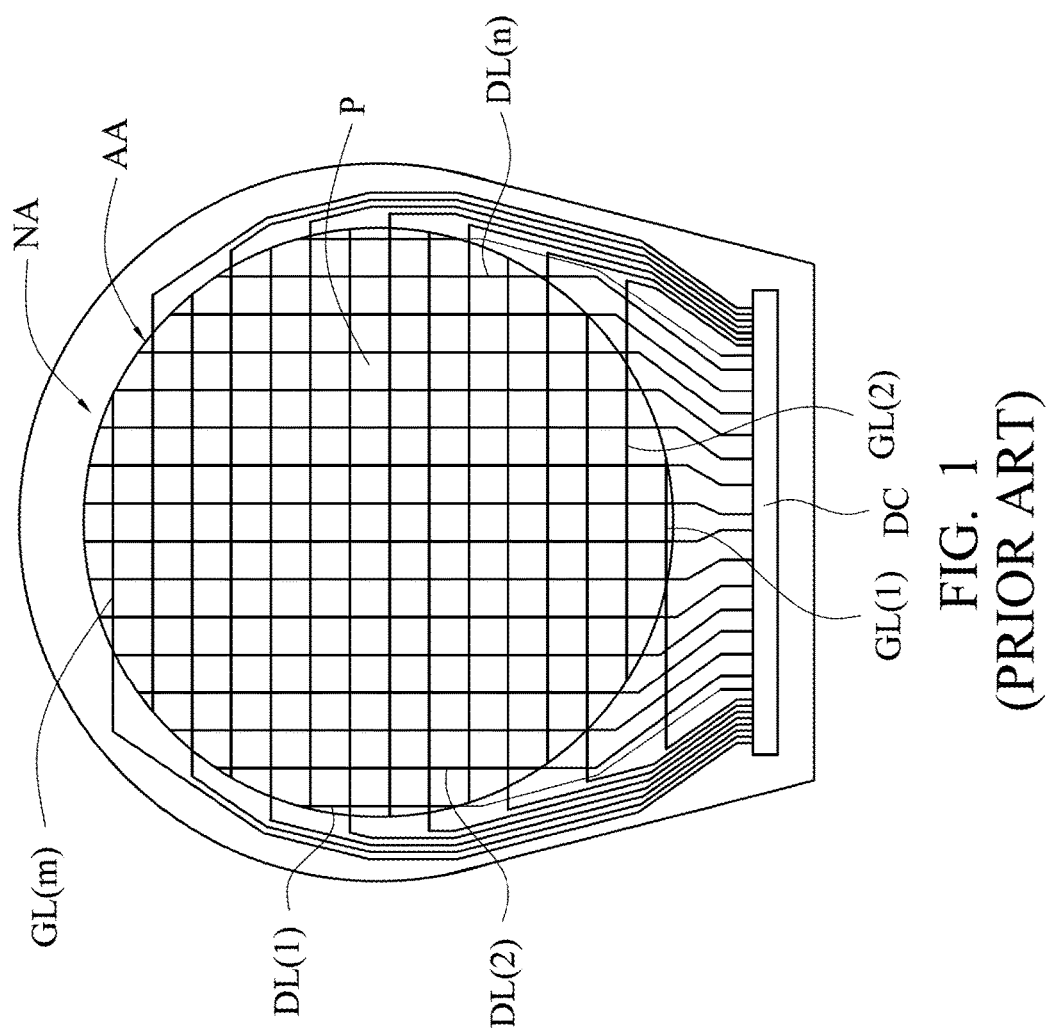
FIG. 1 is a top view of a conventional display panel.
Figure 2:
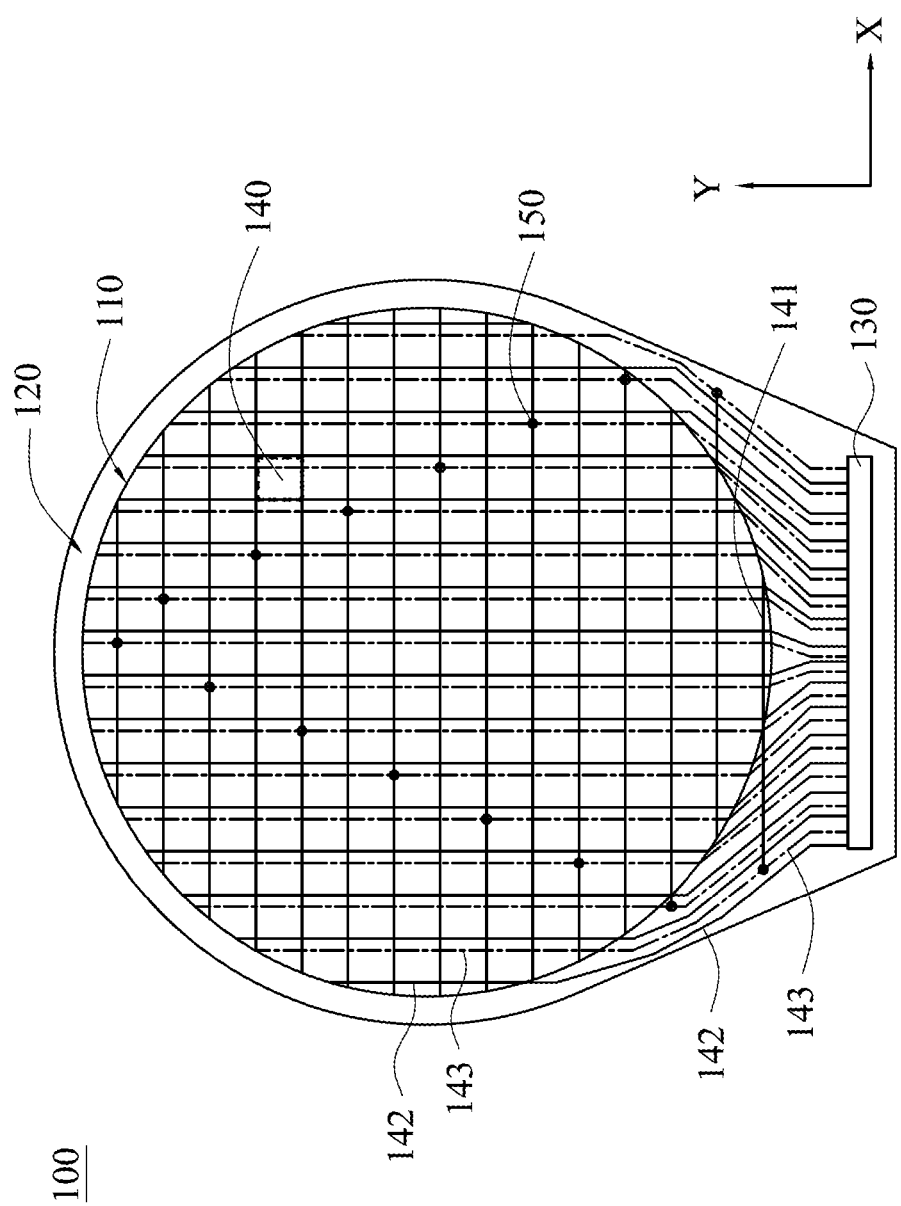
FIG. 2 is a top view of display panel according to an embodiment.

FIG. 2 is a top view of display panel according to an embodiment. Referring to FIG. 2, in the embodiment of FIG. 2, a display panel 100 is a screen of a smart watch, and the display panel 100 has a display area 110 and a non-display area 120, in which the display area 110 is non-rectangular. However, the display panel 100 may be the screen of another mobile device, a screen on an appliance, dashboard in a car, and so on in other embodiments, which is not limited in the invention. In addition, the shape of the display area 110 is circular in the embodiment, but the shape of the non-rectangular display area may be elliptical, triangular, trapezoidal, cardioid or other irregular shapes, which is not limited in the invention.

The display panel 100 includes multiple first signal lines 141, second signal lines 142 and third signal line 143. The first signal lines 141 intersect with the second signal lines 142 to define multiple pixel regions. Note that two adjacent first signal lines 141 intersect with two adjacent second signal lines 142 to define a pixel region in the embodiment of FIG. 2, but the invention is not limited thereto. In some embodiments, such as display panel having dual gate structure, two adjacent first signal lines intersect with two adjacent second signal lines to define two pixel regions. Furthermore, the pixel regions described herein are the pixel regions disposed in the display area 110 of the display panel 100 and do not include dummy pixel region. Each column of the pixel regions has one third signal line 143 disposed therein, and each third signal line 143 is electrically connected to one of the first signal lines 141 through one of connection points 150. As shown in FIG. 2, each third signal line 143 is located in the display area 110 and in the non-display area 120, and is electrically connected to one of the first signal lines 141 through one of connection points 150 located in the display area 110 or the non-display area 120. Note that some of the connection points 150 are located in the non-display area 120 in the embodiment of FIG. 2, but the invention is not limited thereto. In some embodiments, all of the connection points 150 may be located in the display area 110. Material of the first signal lines 141, the second signal lines 142 and the third signal lines 143 includes metal or other conductive material. As shown in FIG. 2, the first signal lines 141 extend along a first direction, the second signal lines 142 and the third signal lines 143 extend along a second direction in the display area 110. In the embodiment, the first direction is essentially perpendicular to the second direction, and that is, the first direction is parallel with X axis, and the second direction is parallel with Y axis. However, the invention is not limited thereto. The angle between the first direction and the second direction may not be equal to 90 degrees in some embodiments. In addition, the extending directions of the second signal lines 142 and the third signal lines 143 may be different from each other. The extending directions of the first signal lines 141, the second signal lines 142 and the third signal lines 143 in the display area 110 are not limited in the invention.

In some embodiments, the first signal lines 141 are gate lines, and the second signal lines 142 are data lines. In other embodiments, the first signal lines 141 are data lines, and the second signal lines 142 are gate lines. In other words, the first signal line 141 is one of gate line and data line, and the second signal line 142 is other one of gate line and data line. Note that the first signal lines 141 and second signal lines 142 described herein are electrically connected to the thin film transistors and do not include dummy signal line, and the gate lines and the data lines described herein do not include dummy gate line and dummy data line. As shown in FIG. 2, the second signal lines 142 and the third signal lines 143 extend toward the non-display area 120 for electrically connecting to a driving circuit 130. In particular, the third signal lines 143 are electrically connected to respective first signal lines 141 through the connection points 150. Accordingly, the first signal lines 141 are electrically connected to the driving circuit 130 through the third signal lines 143. Due to disposition of the first signal lines 141, the second signal lines 142, the third signal lines 143, and the connection points 150 in the embodiment of FIG. 2, data signals of the driving circuit 130 are transmitted to the second signal lines 142, and scan signals of the driving circuit 130 are transmitted to the first signal lines 141 through the third signal lines 143. Alternatively, the scan signals of the driving circuit 130 are transmitted to the second signal lines 142, and the data signals of the driving circuit 130 are transmitted to the first signal lines 141 through the third signal lines 143. In the conventional technology, the first signal lines 141 extend to the non-display area 120 and concentrate toward the driving circuit 130 for electrically connected to the driving circuit 130, and thus the first signal lines 141 would occupy large area of the non-display area 120. However, in the embodiment of FIG. 2, the first signal lines 141 are electrically connected to the driving circuit 130 through the third signal lines 143, and therefore, the wire route in the non-display area 120 is reduced and the width of the non-display area 120 (i.e. border) is decreased.

For the sake of simplification, not all units are illustrated in FIG. 2. For example, the display panel 100 may further include other conductive lines and pixel structures. In some embodiments, some pixel structures are disposed partially in the display area 110 and partially in the non-display area 120. In other embodiments, all pixel structures are disposed in the display area 110, which is not limited in the invention.

Figure 3:
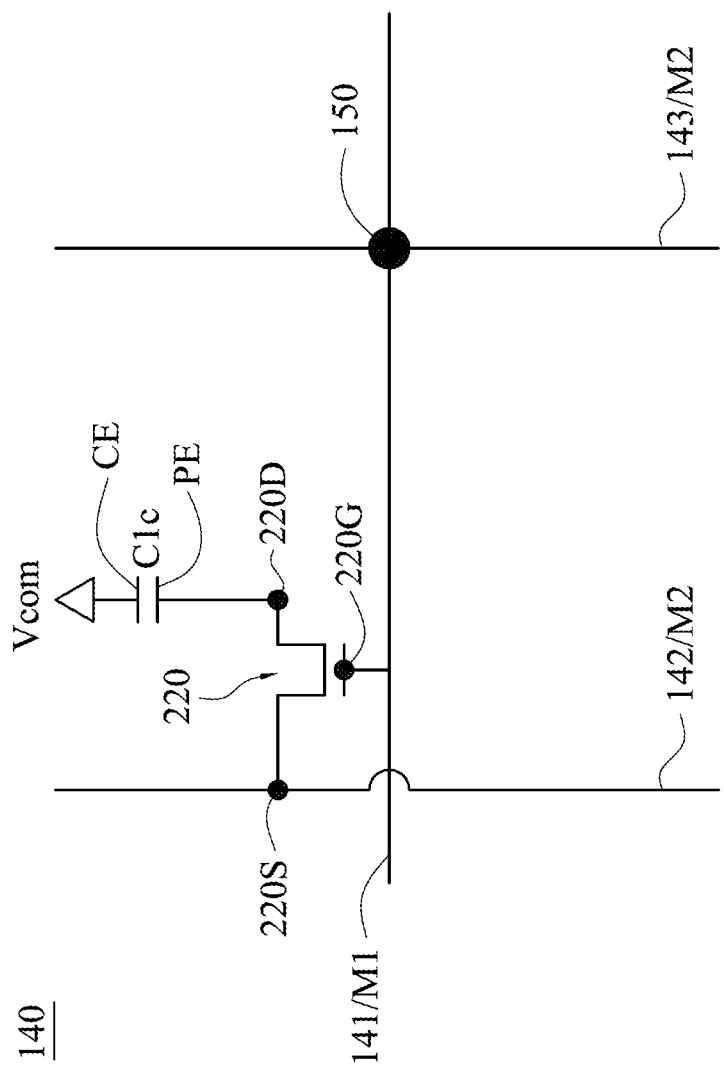
FIG. 3 is a circuit diagram of a pixel structure according to an embodiment.

Referring to FIG. 2 and FIG. 3, the display panel 100 includes multiple pixel structures 140 (only one pixel structure is marked by dash lines in FIG. 2 as an example). FIG. 3 is a circuit diagram of a pixel structure according to an embodiment. A thin film transistor 220 is disposed in the pixel region defined by the intersection of the first signal line 141 and the second signal line 142, and includes a gate 220G, a source 220S and a drain 220D. The gate 220G is electrically connected to the first signal line 141, the source 220S is electrically connected to the second signal line 142, and the drain 220D is electrically connected to a pixel electrode PE. The third signal line 143 is electrically connected to the first signal line 141 through the connection point 150. Two electrodes of a liquid crystal capacitor Clc are the pixel electrode PE and a common electrode CE respectively. The common electrode CE is electrically connected to a common voltage Vcom. As shown in FIG. 2 and FIG. 3, the first signal line 141 and the second signal line 142 intersect, and therefore the first signal line 141 and the second signal line 142 are formed in different metal layers and are electrically insulated from the each other. In addition, the first signal line 141 and the third signal line 143 intersect, and the third signal line 143 is electrically connected to the respective first signal line 141 through the connection point 150, and therefore the first signal line 141 and the third signal line 143 are formed in different metal layers. In the embodiment, the first signal line 141 is formed in a first metal layer M1, and the second signal line 142 and the third signal line 143 are formed in a second metal layer M2. However, the invention is not limited thereto. The first signal line 141 may be formed in the second metal layer M2, and the second signal line 142 and the third signal line 143 are formed in the second metal layer M1 in other embodiments.

Note that not every pixel structure 140 has the connection point 150 as shown in FIG. 2. Therefore, the circuit diagram of pixel stricture 140 in FIG. 3 is corresponding to the pixel structure 140 having the connection point 150. With respect to circuit diagram for the pixel structure 140 not having the connection point 150, the connection point 150 is removed from FIG. 3, and the rest is identical to FIG. 3 (the description would not be repeated). Furthermore, the first signal line 141 is gate line and the second signal line 142 is data line in the embodiment of FIG. 3. In the embodiment that the first signal line 141 is data line and the second signal line 142 is gate line, the gate 220G of the thin film transistor 220 is electrically connected to the second signal line 142, and the source 220S is electrically connected to the first signal line 141, and the rest is identical to FIG. 3 (the description would not be repeated).

In the embodiment of FIG. 2, the driving circuit 130 includes a gate driving circuit and a data driving circuit (also referred to a source driving circuit) which are disposed in the non-display area 120. The gate driving circuit and the data driving circuit are disposed in the same chip or disposed in different chips. In other embodiments, the gate driving circuit and the data driving circuit includes thin film transistors, and thin film transistors in the driving circuit 130 and the thin film transistor 220 in the pixel structure 140 are formed on a substrate of the display panel 100. For example, the thin film transistors in the gate driving circuit and the data driving circuit, and the thin film transistors in the pixel structures 140 are formed on the substrate by a low-temperature polysilicon process. Only one driving circuit 130 is illustrated in FIG. 2, but the number of the driving circuit 130 is not limited in the invention.

Figure 4:
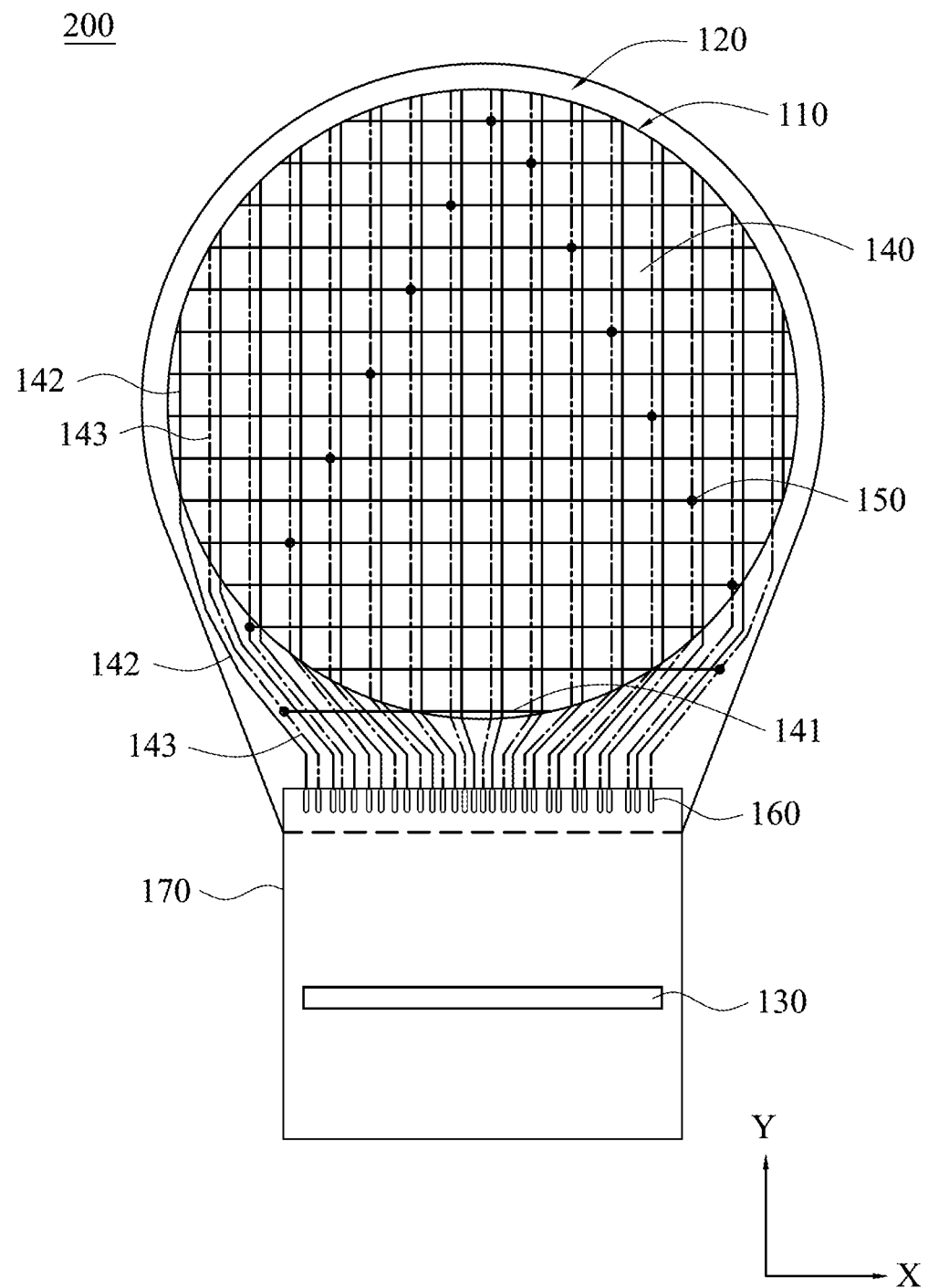
FIG. 4 is a schematic diagram illustrating a top view of the display panel 200 according to another embodiment.

FIG. 4 is a schematic diagram illustrating a top view of a display panel 200 according to another embodiment. Referring to FIG. 4, multiple bonding pads 160 are disposed in the non-display area 120. The second signal lines 142 and the third signal lines 143 extend toward the non-display area 120 for electrically connecting to the bonding pads 160. The driving circuit 130 is disposed on a flexible circuit board 170 (e.g. Tape Carrier Package (TCP) or Chip on Film (COF)). There are multiple bonding leads (not shown) disposed at one side of the flexible circuit board 170 for electrically connecting to the bonding pads 160. The flexible circuit board 170 has wires (not shown) for electrically connecting the driving circuit 130 and the bonding leads so that the driving circuit 130 is electrically connected to the bonding pads 160, and the driving circuit 130 may provide the scan signals and the data signals to the second signal lines 142 and the third signal lines 143. In the embodiments, the driving circuit 130 includes a gate driving circuit and a data driving circuit that may be disposed in the same chip or disposed in different chips respectively.

Figure 5:
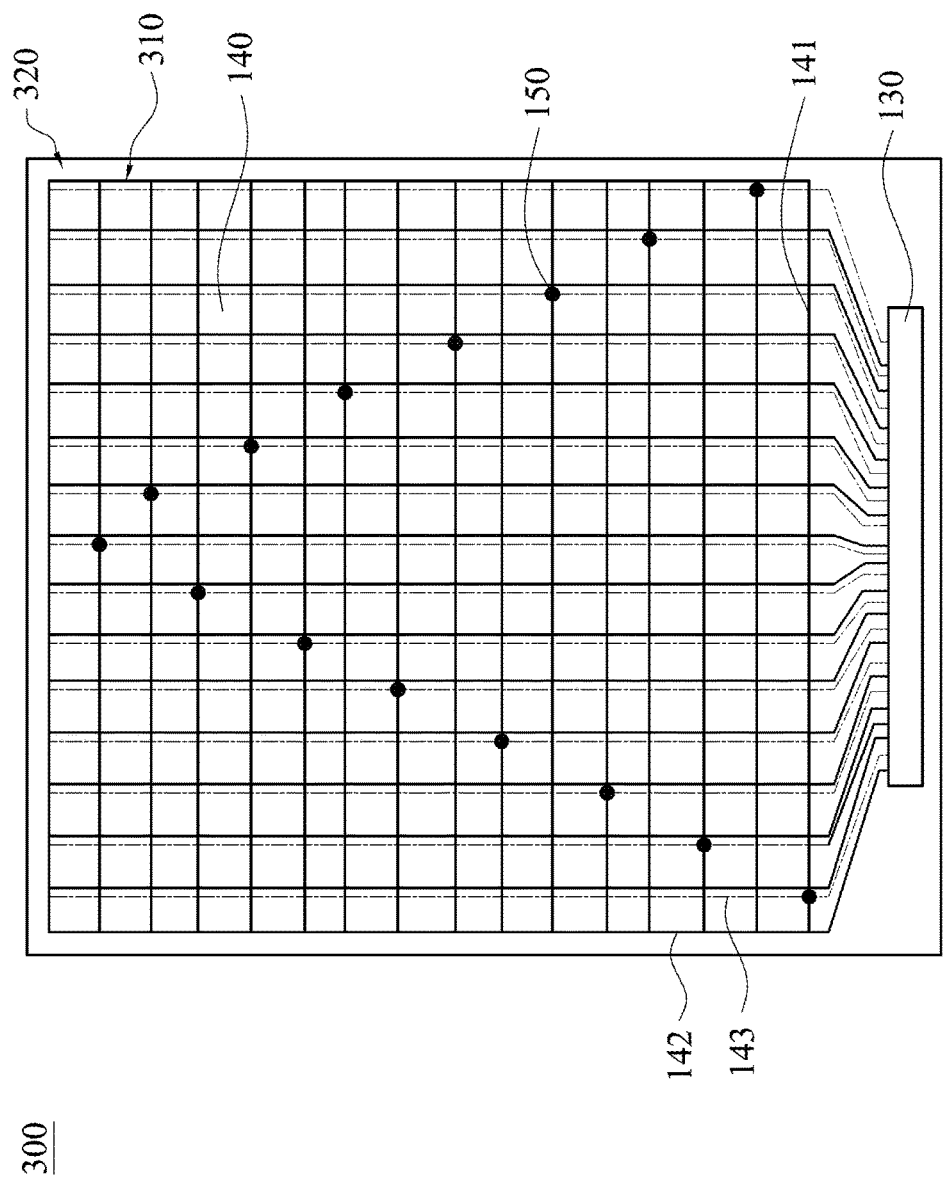
FIG. 5 is a top view of the display panel according to another embodiment.

FIG. 5 is a top view of the display panel according to another embodiment. Referring to FIG. 5, a display panel 300 includes a display area 310 and a non-display area 320. The difference between FIG. 2 and FIG. 5 is that the display area 110 of the display panel 100 is non-rectangular in FIG. 2, but the display area 310 of the display panel 300 is rectangular in the embodiment of FIG. 5. Rest part of FIG. 5 is similar with FIG. 2, and it will not be repeated. As shown in FIG. 5, each third signal line 143 is electrically connected to one of the first signal lines 141 through one of connection points 150, and is electrically connected to the driving circuit 130, therefore the first signal lines 141 are electrically connected to the driving circuit 130 through the third signal lines 143, and thus there is no need for the first signal lines 141 to extend to the non-display area 320, and the width of the non-display area 320 (i.e. border) may be reduced. Therefore, the shape of the display area is not limited in the invention.

Figure 6:
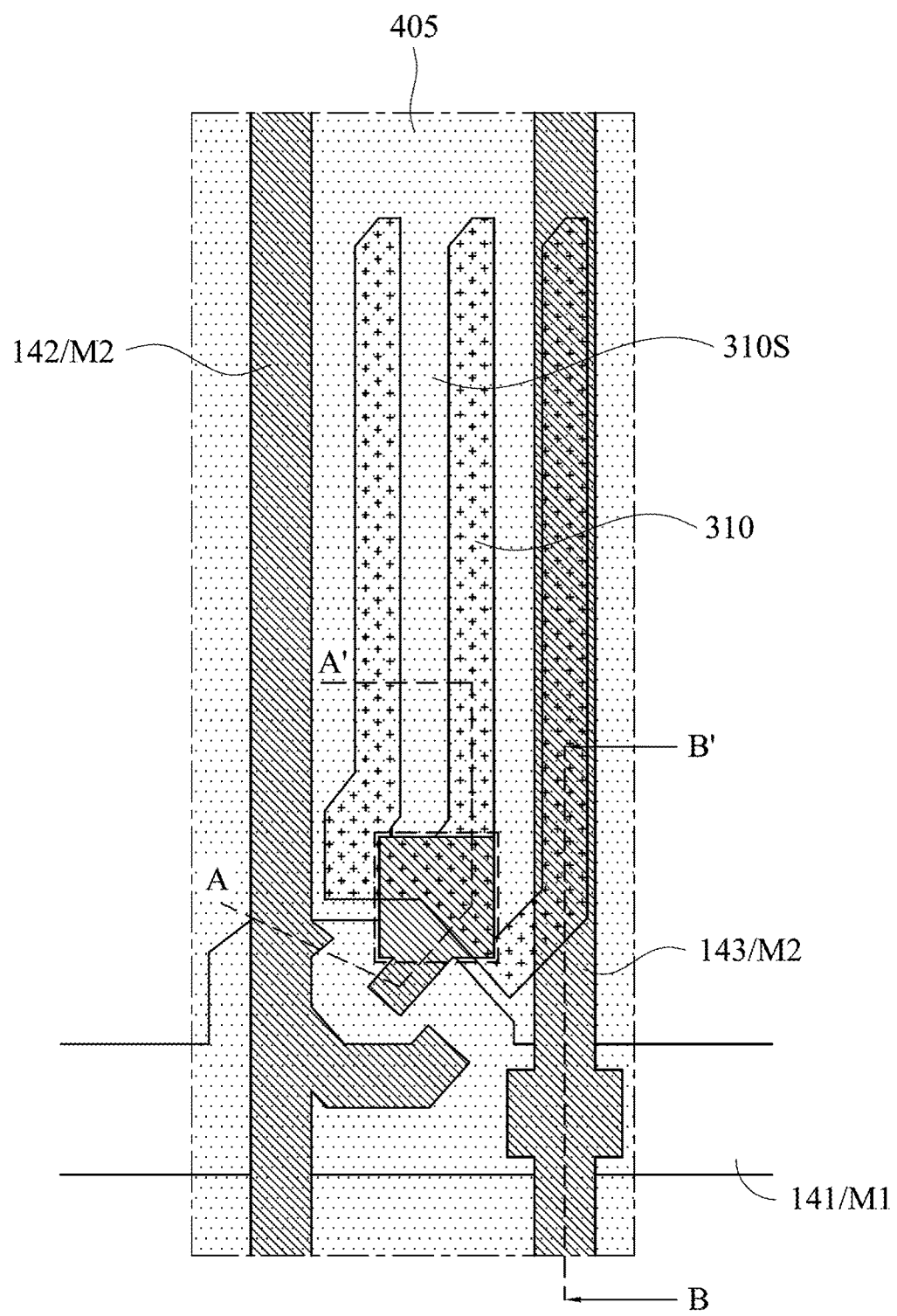
FIG. 6 is a top view of a pixel structure according to an embodiment.
Figure 7:
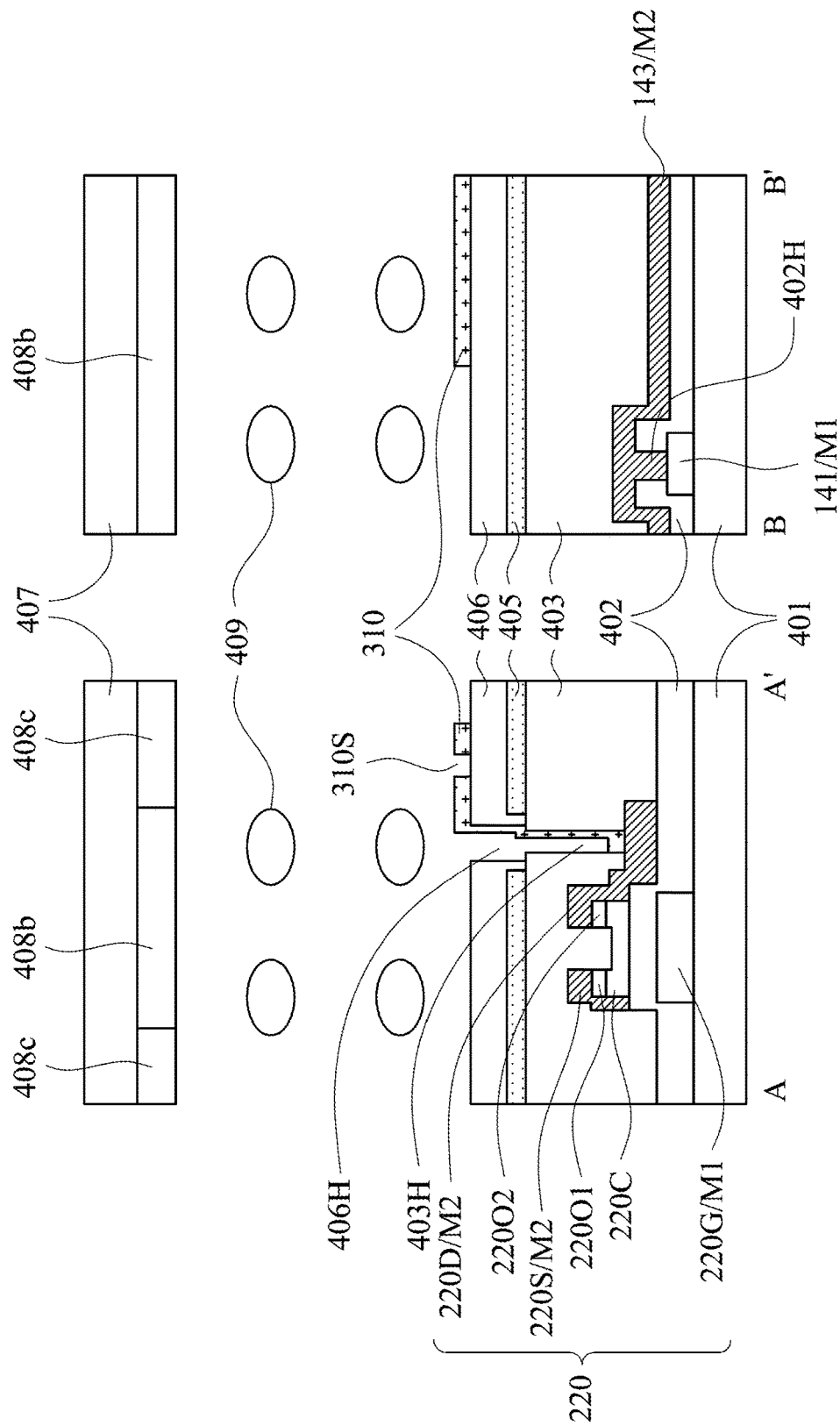
FIG. 7 is a cross-sectional view of the pixel stricture along cross-section lines AA' and BB' of FIG. 6.

Referring to FIG. 6 and FIG. 7, FIG. 6 is a top view of a pixel structure according to an embodiment, and FIG. 7 is a cross-sectional view of the pixel stricture along cross-section lines AA' and BB' of FIG. 6. In the embodiments of FIG. 6 and FIG. 7, the display panel is a display panel in a transverse electric field mode or a horizontal electric field mode. As shown in FIG. 6 and FIG. 7, the thin film transistor 220 and the pixel electrode 310 locate at the pixel region defined by the intersection of the first signal line 141 and the second signal line 142. To be specific, a first substrate 401 is, for example, glass. A first metal layer M1 is formed on the first substrate 401, and the first metal layer M1 includes the gate 220G and the first signal line 141. An insulation layer 402 (also referred to a first insulation layer or a gate insulation layer) is formed on the first metal layer M1 and covers the gate 220G and the first signal line 141. The insulation layer 402 has a via 402H to expose the first signal line 141. A semiconductor layer 220C is formed on the insulation layer 402. Ohmic contact layers 220O1 and 220O2 are formed on two sides of the semiconductor layer 220C. A second metal layer M2 is formed on the ohmic contact layers 220O1 and 220O2. The second metal layer M2 includes a source 220S, a drain 220D, the second signal line 142 and the third signal line 143. The source 220S and the drain 220D are electrically connected to the ohmic contact layers 220O1 and 220O2 respectively. The third signal line 143 is electrically connected to the first signal line 141 through the via 402H. As shown in FIG. 2 and FIG. 3, the third signal line 143 is electrically connected to the corresponding first signal line 141 through the connection point 150, and therefore, the connection point 150 of FIG. 2 and FIG. 3 is formed by the via 402H of the insulation layer 402 in the embodiment. It is noted that, in the embodiment of FIG. 2, each third signal line 143 is electrically connected to one of the first signal lines 141 through one of connection points 150 (also referred to vias 402H), however, the invention is not limited thereto. In other embodiments, each third signal line 143 is electrically connected to one of the first signal lines 141 through at least two connection points 150 (also referred to vias 402H) to reduce the connection resistance. The insulation layer 403 (also referred to a second insulation layer) is formed on the second metal layer M2, and the insulation layer 403 includes an opening 403H to expose the drain 220D. A transparent conductive layer 405 is formed on the insulation layer 403, and is taken as a common electrode in the embodiment. The material of the transparent conductive layer 405 includes indium tin oxide (ITO), indium zinc oxide (IZO) or other transparent conductive material. An insulation layer 406 (also referred to a third insulation layer) is formed on the transparent conductive layer 405, and the insulation layer 406 has an opening 406H. As shown in FIG. 7, the opening 406H is corresponding to the opening 403H, and the stacked openings 403H and 406H expose the drain 220D. A pixel electrode 310 is formed on the insulation layer 406, and is electrically connected to the drain 220D through the openings 406H and 403H. A second substrate 407 is disposed opposite to the first substrate 401, and a color filter layer 408c and a mask layer 408b are disposed on a surface of the second substrate 407 facing the first substrate 401. Liquid crystal 409 is disposed between the first substrate 401 and the second substrate 407. In addition, the pixel electrode 310 has slits 310S, and electrical field between the pixel electrode 310 and the transparent conductive layer 405 is used to change the orientation of the liquid crystal 409. The shape of the pixel electrode 310 is like a fork having the slits 310S in the embodiment of FIG. 6, but the invention is not limited thereto. For example, the shape of the pixel electrode may be a plate structure having slits.

For the sake of simplification, not all units are shown in FIG. 6 and FIG. 7. For example, in some embodiments, two alignment layers are disposed on surfaces of the first substrate 401 and the second substrate 407 facing the liquid crystal respectively to align the liquid crystal 409. In other embodiments, an over-coating layer is disposed on the surface of the second substrate 407 facing the liquid crystal for planarization. Furthermore, each of the insulation layers 402, 403 and 406 may be a single layer structure, or at least one of the insulation layers 402, 403 and 406 is a multi-layer structure. For example, the insulation layer 402 generally includes organic material because it has advantages of planarization. However, adhesion between the organic material and a metal layer is generally poor, and therefore the insulation layer 402 further includes nonorganic material disposed between the organic material and the metal layer. That is to say, the insulation layer 402 is a double-layer structure.

As shown in FIG. 6 and FIG. 7, when viewed from a direction perpendicular to a top surface of the first substrate 401, the third signal line 143 extends through the pixel region defined by the intersection of the first signal line 141 and the second signal line 142. In addition, a transparent conductive layer 405 is disposed between the pixel electrode 310 and the third signal line 143. When viewed from a direction perpendicular to the top surface of the first substrate 401, the transparent conductive layer 405 covers the third signal line 143. Therefore, the transparent conductive layer 405 can shield the interference between the third signal line 143 and the pixel electrode 310, and the visual performance of the display panel 100 would not be affected. From another aspect, projections of the pixel electrode 310, the transparent conductive layer 405 and the third signal line 143 onto the first substrate 401 are at least partially overlapped with each other.

Figure 8:
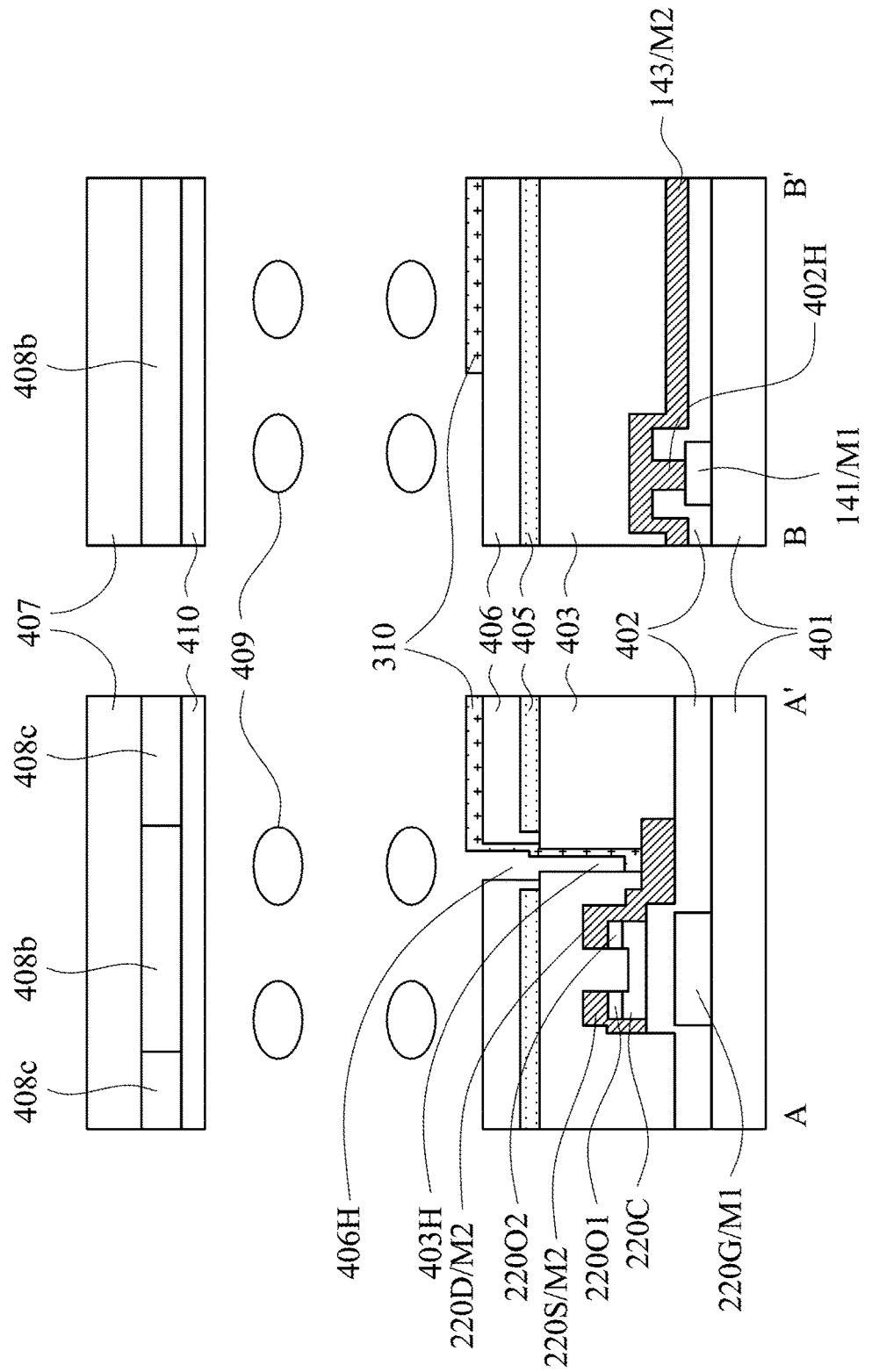
FIG. 8 is a cross-sectional view of the pixel structure in a twisted nematic (N) display panel according to some embodiments.

The display panels in the embodiments of FIG. 6 and FIG. 7 are the transverse electric field mode or the horizontal electric field mode display panel, but the invention is not limited thereto, the display panel in other embodiments may be a Vertical Align (VA) mode or Twisted Nematic (TN) mode display panel. For example, referring to FIG. 8, FIG. 8 is a cross-sectional view of the pixel structure in TN display panel according to some embodiments. A difference between FIG. 7 and FIG. 8 is that, in FIG. 8, the color filter layer 408c, the mask layer 408b and a transparent conductive layer 410 are disposed on the surface of the second substrate 407 facing the first substrate 401, and the pixel electrode 310 is a plate structure without slits. In the embodiment of FIG. 8, the transparent conductive layer 410 is electrically connected to a common voltage and taken as a common electrode. The electrical field between the pixel electrode 310 and the transparent conductive layer 410 is used to change the orientation of the liquid crystal 409, and the capacitor formed by the transparent conductive layer 405, the pixel electrode 310 and the insulation layer 406 is taken as a storage capacitor. In the embodiment of FIG. 8, the transparent conductive layer 405 also covers the third signal line 143 for shielding the interference between the third signal line 143 and the pixel electrode 310.

Furthermore, with respect to the VA display panel, the structure of the first substrate 401 is similar to that of FIG. 8, and therefore the description will not be repeated in detail. For example, bumps are disposed on the first substrate 401 and/or the second substrate 407 in some embodiments. In other embodiments, the pixel electrode 301 on the first substrate 401 and/or the transparent conductive layer (e.g. common electrode) 410 on the second substrate 407 may have certain patterns to tilt the liquid crystal molecule. Similarly, the transparent conductive layer 405 covers the third signal line 143 for shielding the interference between the third signal line 143 and the pixel electrode 310.

Note that not every pixel structure 140 has the connection point 150, and therefore the cross-sectional views of the pixel structure in FIG. 6 and FIG. 7 are corresponding to the pixel structure 140 having the connection point 150. With respect to the corresponding cross-sectional view of the pixel structure 140 without connection point 150, only the via 402H is removed, and the rest is identical to FIG. 6 and FIG. 7, and therefore the description will not be repeated.

Figure 9:
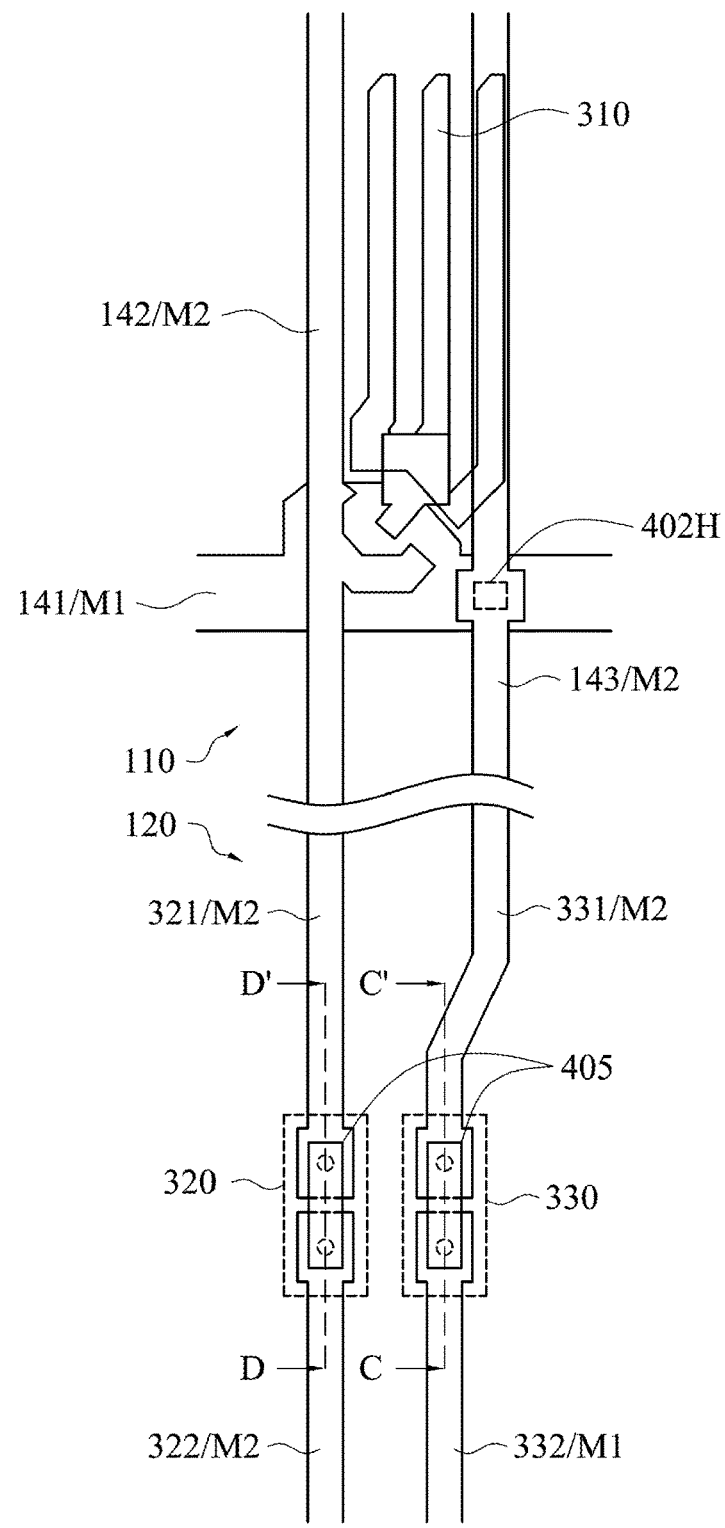
FIG. 9 is a top view of part of the display panel according to an embodiment.

Referring to FIG. 9, FIG. 9 is a top view of part of the display panel according to an embodiment. For the sake of illustration and description, only the first metal layer M1, the second metal layer M2, the via 402H and the pixel electrode 310 are illustrated in the pixel structure 140 of FIG. 9, and detailed top view of the pixel structure 140 may be referred to FIG. 6. The second signal line 142 and the third signal line 143 in the non-display area 120 would extend toward the driving circuit 130. However, the second signal line 142 and the third signal line 143 are formed in the same metal layer (both formed in a second metal layer M2 in the embodiment), causing that the spacing between the second signal line 142 and third signal line 143 cannot be very small to avoid short therebetween. Therefore, in some embodiments, one of the second signal line 142 and the third signal line 143 is transferred to a first metal layer M1 in the non-display area 120 to reduce the spacing between the two lines. For example, in FIG. 9, the second signal line 142 has a first part 321 and a second part 322, and both of the first part 321 and the second part 322 are formed in the second metal layer M2. The third signal line 143 has a first part 331 and a second part 332, in which the first part 331 is formed in the second metal layer M2, but the second part 332 is formed in the first metal layer M1. Connection structures 320 are 330 are disposed in the non-display area 120. The connection structure 320 is used for electrically connecting the first part 321 and the second part 322. The connection structure 330 is used for electrically connecting the first part 331 and the second part 332.

Figure 10:
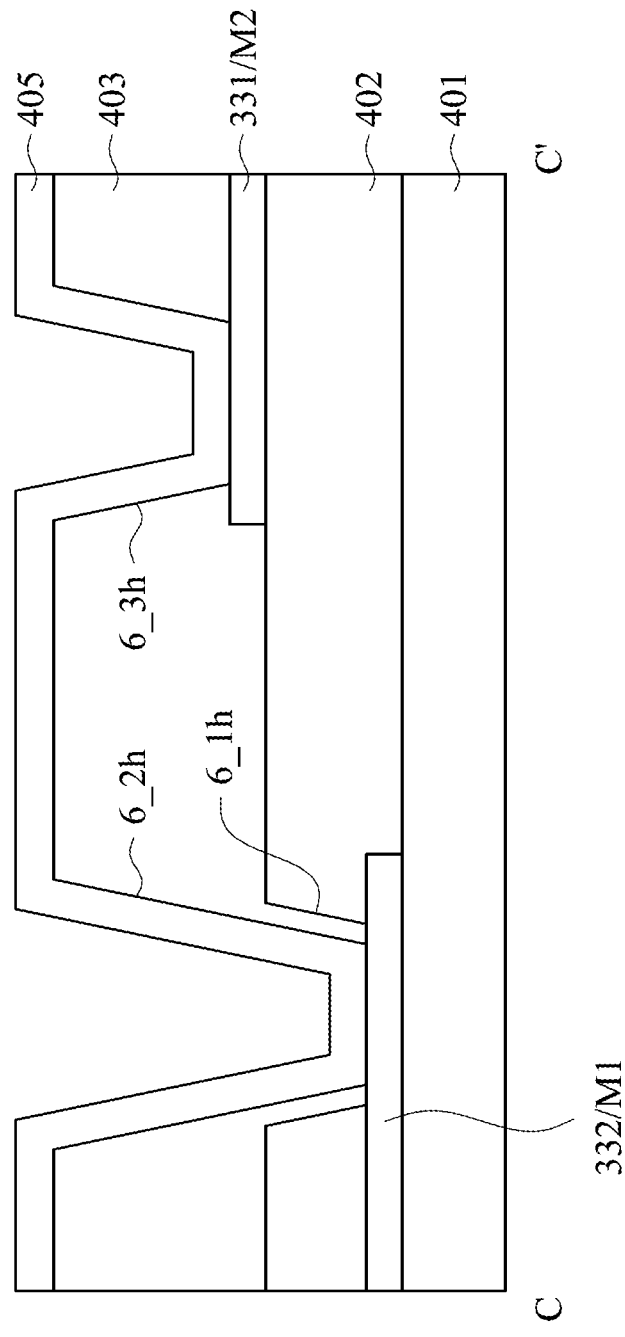
FIG. 10 is a cross-sectional view of a connection structure 330 along a cross-sectional line CC' of FIG. 9.

Referring to FIG. 10, FIG. 10 is a cross-sectional view of a connection structure 330 along a cross-sectional line CC' of FIG. 9. The second part 332 formed in the first metal layer M1 is disposed on the substrate 401. The first insulation layer 402 is disposed on the first metal layer M1 and has a first opening 6_1h to expose the second part 332. The first part 331 formed in the second metal layer M2 is disposed on the first insulation layer 402. The second insulation layer 403 is disposed on the second metal layer M2, and has a second opening 6_2h corresponding to the first opening 6_1h, and a third opening 6_3h to expose the first part 331. The transparent conductive layer 405 is disposed on the second insulation layer 403, and is electrically connected to the first part 331 through the third opening 6_3h, and is electrically connected to the second part 332 through the second opening 6_2h. That is, the transparent conductive layer 405 electrically connects the first part 331 and the second part 332.

Figure 11:
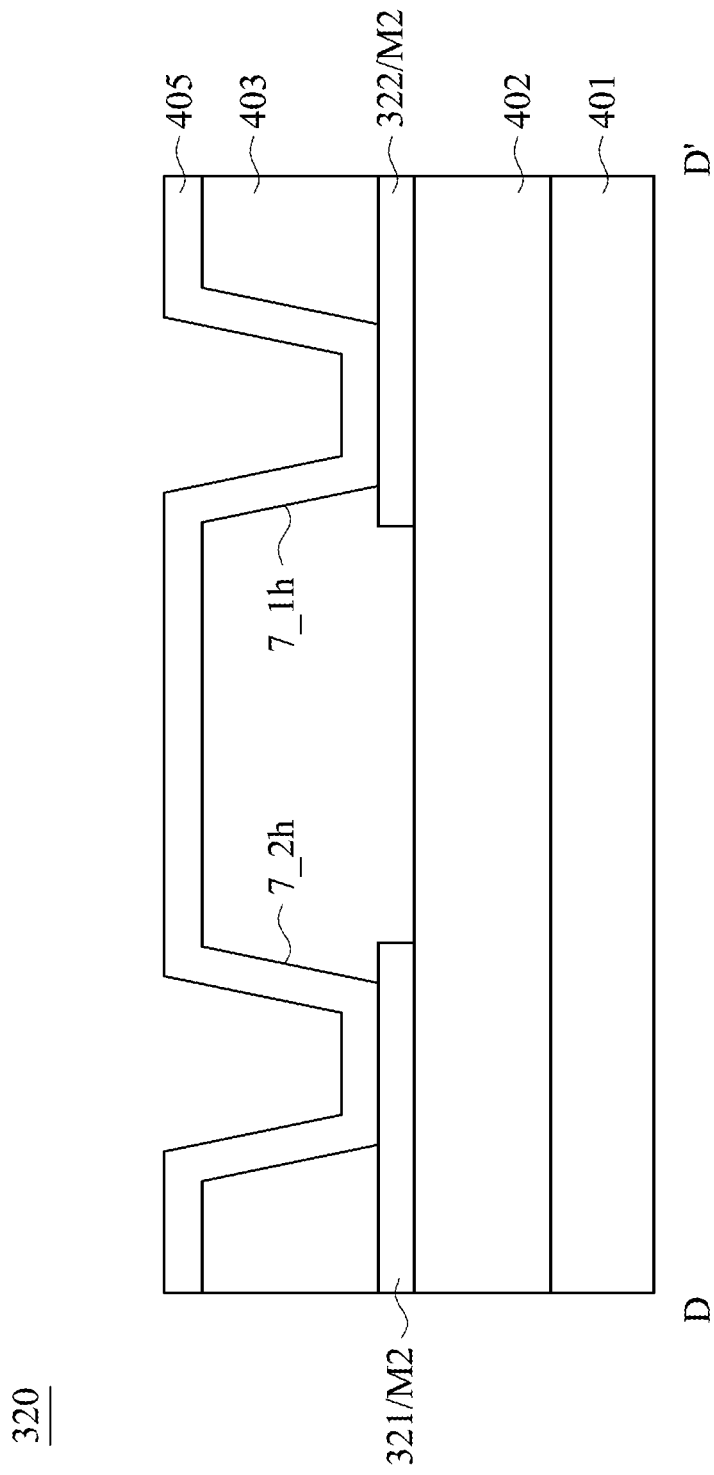
FIG. 11 is cross-sectional view of the connection structure 330 along a cross-sectional line DD' of FIG. 9.

FIG. 11 is cross-sectional view of the connection structure 330 along a cross-sectional line DD' of FIG. 9. Referring to FIG. 11, the first insulation layer 402 is disposed on the substrate 401. The first part 321 and the second part 322 are formed in the second metal layer M2 and disposed on the first insulation layer 402. The second insulation layer 403 is disposed on the second metal layer M2, and has a first opening 7_1h to expose the first part 321, and a second opening 7_2h to expose the second part 332. The transparent conductive layer 405 is disposed on the second insulation layer 403, and is electrically connected to the first part 321 through the first opening 7_1h, and is electrically connected to the second part 322 through the second opening 7_2h. That is, the transparent conductive layer 405 electrically connects the first part 321 and the second part 322. Referring to FIG. 9, although the first part 321 and the second part 322 of the second signal line 142 are formed in the second metal layer M2, the connection structure 320, which electrically connects the first part 321 and the second part 322 formed in the second metal layer M2 through the transparent conductive layer 405, is additionally disposed between the first part 321 and the second part 322 of the second signal line 142 because the first part 331 and the second part 332 of the third signal line 143 is electrically connected to the each other through the connection structure 330 which electrically connects different metal layers through the transparent conductive layer 405. Therefore, the resistance of the second signal line 142 matches with that of the third signal line 143.

Note that the third signal line 143 is transferred from the second metal layer M2 to the first metal layer M1 in the non-display area 120 in the embodiment of FIG. 9. However, in other embodiments, the second signal line 142 and the third signal line 143 may be both formed in the second metal layer M2 in the display area 120, and the third signal line 143 is formed in the second metal layer M2 in the non-display area 120, and the different parts of the third signal line 143 in the non-display area 120 are electrically connected through a connction structure similar to the connection structure 320, and the second signal line 142 is transferred from the second metal layer M2 to the first metal layer M1 through a connection structure similar to the connection structure 320 in the non-display area 120.

Figure 12:
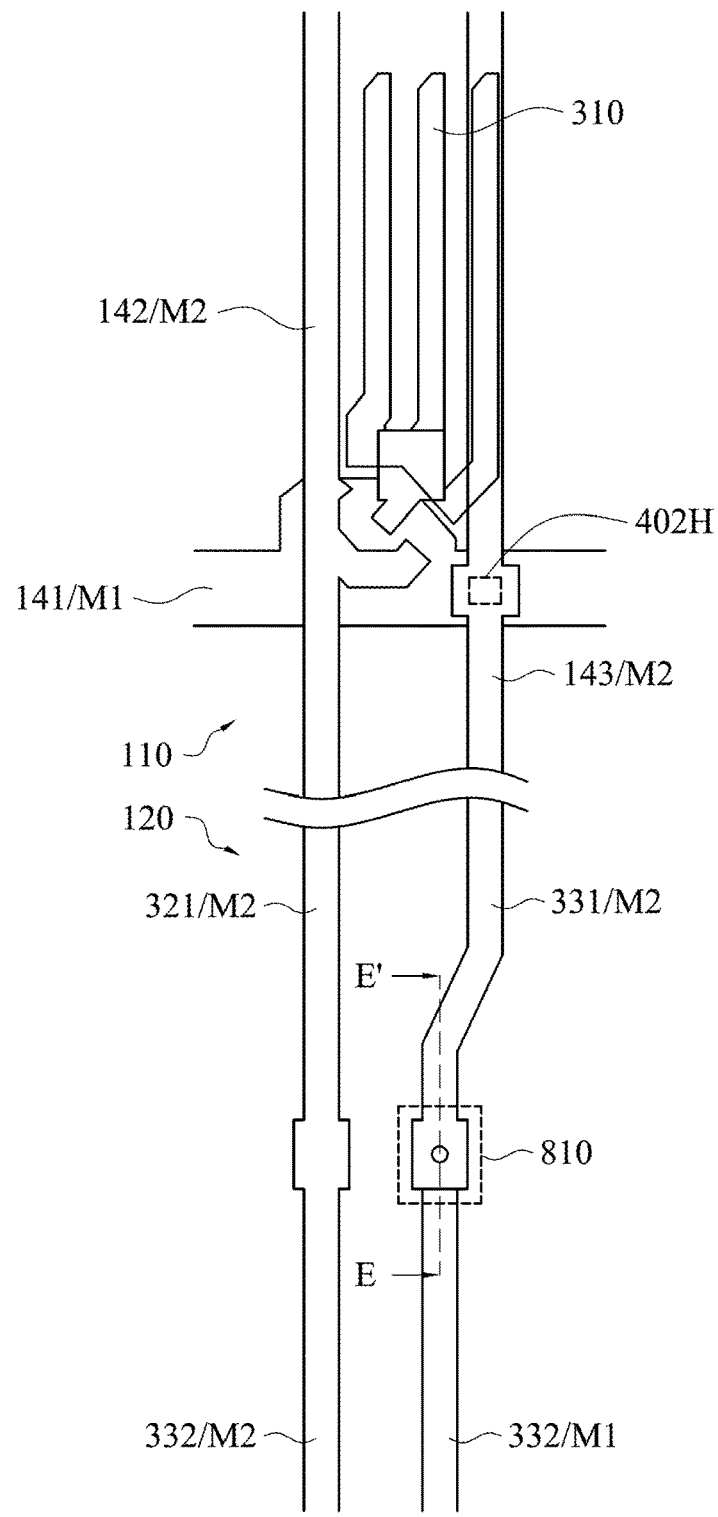
FIG. 12 is a top view of a pixel structure according to an embodiment.
Figure 13:
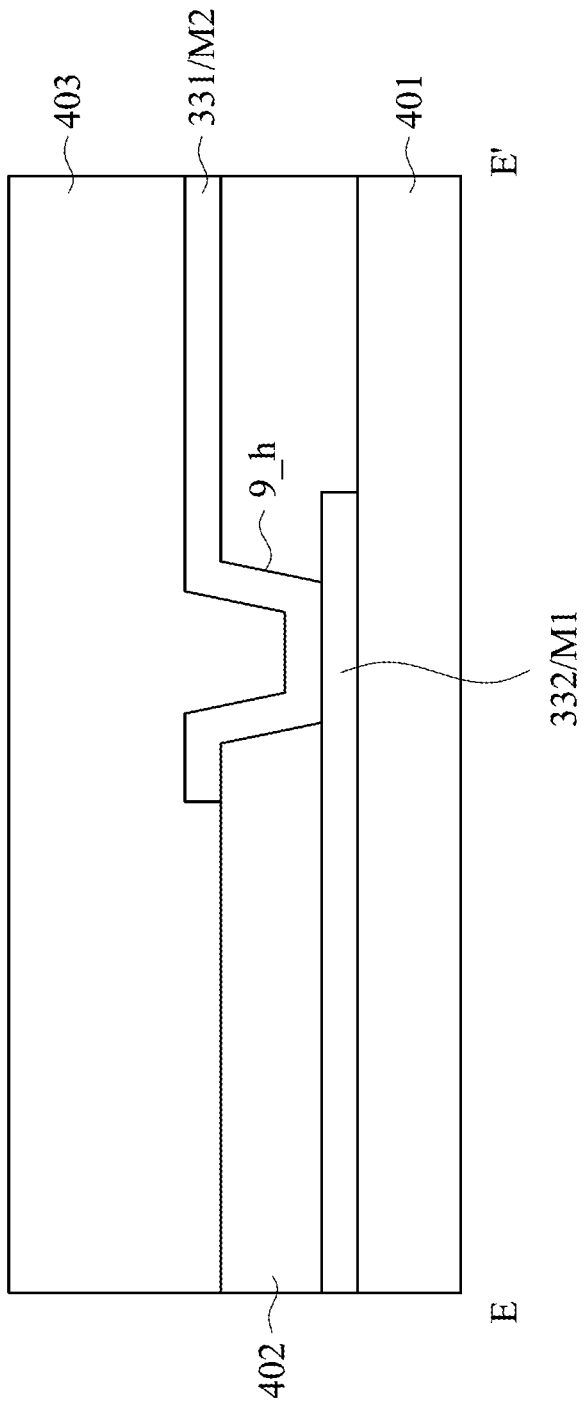
FIG. 13 is a cross-sectional view of a connection structure 810 along a cross-sectional line EE' of FIG. 12.

FIG. 12 is a top view of a pixel structure according to an embodiment. FIG. 12 is similar to FIG. 9, and identical or similar units will not be described or labeled again. In FIG. 12, the first part 321 and the second part 322 of the second signal line 142 are formed in the second metal layer M2, and the first part 321 is directly connected to the second part 322. However, the first part 331 of the third signal line 143 is formed in the second metal layer M2, and the second part 332 is formed in the first metal layer M1. A connection structure 810 is used to electrically connect the first part 331 and the second part 332. To be specific, referring to FIG. 13, FIG. 13 is a cross-sectional view of a connection structure 810 along a cross-sectional line EE' of FIG. 12. The second part 332 is disposed on the substrate 401. The first insulation layer 402 is disposed on the first metal layer M1, and has an opening 9_h to expose the second part 332. The first part 331 formed in the second metal layer M2 is disposed on the first insulation layer 402, and is electrically connected to the second part 332 through the opening 9_h.

In the embodiments, because the connection structure 810 directly connects different metal layers through the opening 9_h of the first insulation layer 402, the connection structure 810 has smaller resistance compared with the connection structure 330 of FIG. 10 in which the transparent conductive layer 405 is electrically connected to different metal layers. Due to the smaller resistance of the connection structure 801, the first part 321 and the second part 322 of the second signal line 142 are directly connected to the each other in the embodiment without additionally disposing a connection structure between the first part 321 and the second part 322 of the second signal line 142.

In the embodiments of FIG. 12 and FIG. 13, the third signal line 143 is transferred from the second metal layer M2 to the first metal layer M1. However, in other embodiments, both of the second signal line 142 and the third signal line 143 may be formed in the second metal layer M2 in the display area 110, and the third signal line 143 is formed in the second metal layer M2 in the non-display area 120, and the second signal line 142 is transferred from the second metal layer M2 to the first metal layer M1 through a connection structure similar to the connection structure 810 in the non-display area 120.

Figure 14:
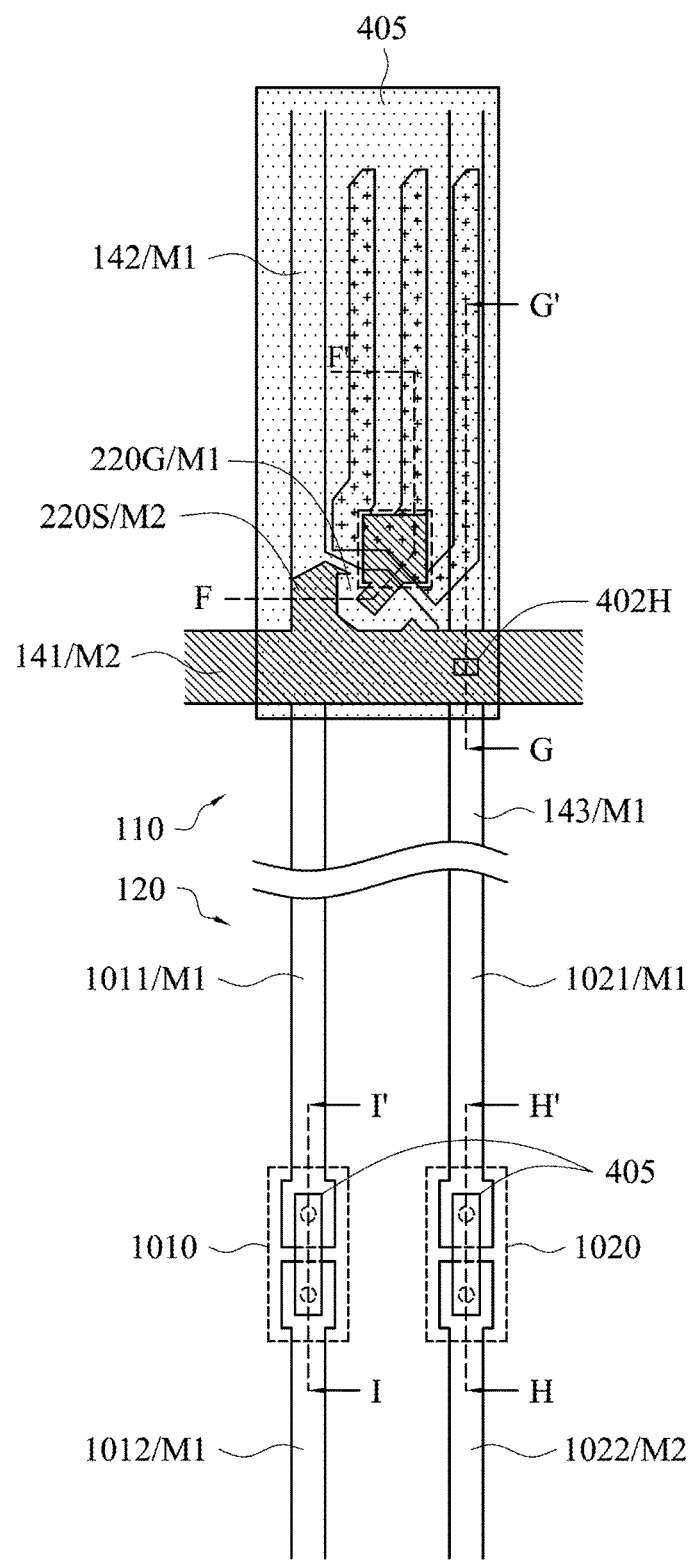
FIG. 14 is a top view of a pixel structure according to an embodiment.
Figure 15:
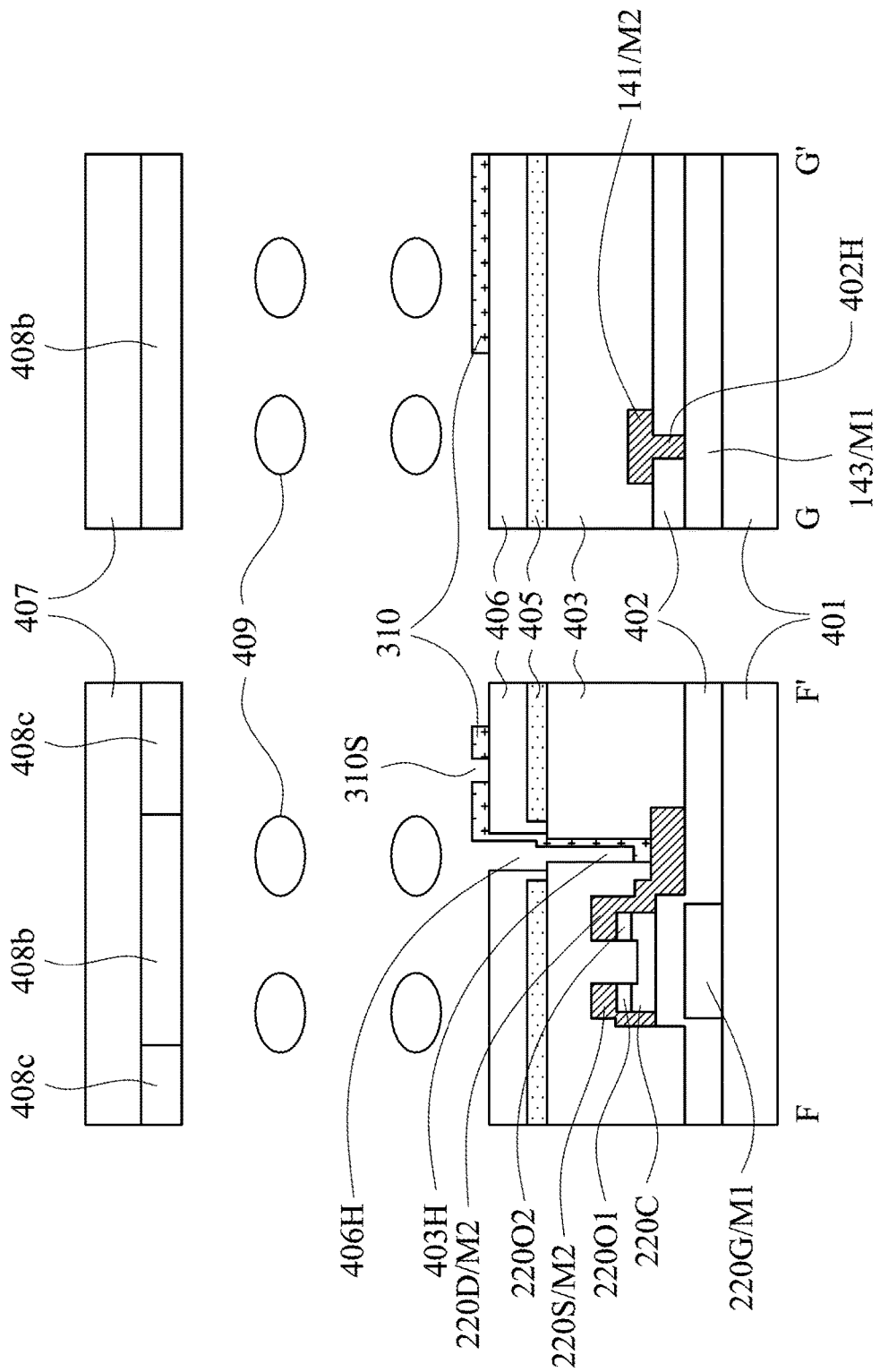
FIG. 15 is a cross-sectional view of the pixel structure along cross-sectional lines FF' and GG' of FIG. 14.

Referring to FIG. 6 and FIG. 7 again, in the aforementioned embodiments, the first signal line 141 is gate line and formed in the first metal layer, the second signal line 142 is data line and formed in the second metal layer, and the third signal line 143 is formed in the second metal layer. However, the invention is not limited thereto, the gate line and the data line may be exchanged in other embodiments. In detail, referring to FIG. 14, FIG. 14 is a top view of a pixel structure according to an embodiment. In the embodiment of FIG. 14, the first signal line 141 is data line and formed in the second metal layer, the second signal line 142 is gate line and formed in the first metal layer, and the third signal line 143 is formed in the first metal layer M1 in the display area 110. In other words, the first signal line 141 is electrically connected to the source 220S of the thin film transistor, and the second signal line 142 is electrically connected to the gate 220G. FIG. 15 is a cross-sectional view of the pixel structure along cross-sectional lines FF' and GG' of FIG. 14. FIG. 15 is similar to FIG. 7, and identical symbols will not be described again. What is different from FIG. 7 is, in FIG. 15, the third signal line 143 is formed in the first metal layer M1, and the first signal line 141 formed in the second metal layer M2 is connected to the third signal line 143 through the via 402H of the first insulation layer 402.

Note that in the embodiments of FIG. 2 and FIG. 5, pixel structures are arranged as multiple columns and multiple rows, each column includes multiple pixel structures, and each row includes multiple pixel structures, but the invention is not limited thereto. In some embodiments such as display panel having non-rectangular display, at least one column located at the edge of the display area includes only one pixel structure, and/or at least one row located at the edge of the display area includes only one pixel structure. In summary, if the first signal lines 141 are the gate lines and the second signal lines 142 are the data lines, each first signal line 141 is electrically connected to the gate of at least one of the thin film transistors, and each second signal line 142 is electrically connected to the source of at least one of the thin film transistors. If the first signal lines 141 are the data lines and the second signal lines 142 are the gate lines, each first signal line 141 is electrically connected to the source of at least one of the thin film transistors, and each second signal line 142 is electrically connected to the gate of at least one of the thin film transistors. In other words, in the display panel of the invention, every first signal line 141 is electrically connected to one of the gate and the source of at least one of the thin film transistors, and every second signal line 142 is electrically connected to the other one of the gate and the source of at least one of the thin film transistors. No matter the first signal line 141 is gate line or data line, the third signal line 143 is electrically connected to the corresponding first signal line 141 through the connection point 150 so that the first signal line 141 is electrically connected to the driving circuit 130 through the third signal line 143.

Referring to FIG. 14, the second signal line 142 has a first part 1011 and a second part 1012 formed in the first metal layer M1. The third signal line 143 has a first part 1021 formed in the first metal layer M1 and a second part 1022 formed in the second metal layer M2. Connection structures 1010 and 1020 are disposed in the non-display area 120. The connection structure 1010 is used to electrically connect the first part 1011 and the second part 1012. The connection structure 1020 is used to electrically connect the first part 1021 and the second part 1022.

Figure 16:
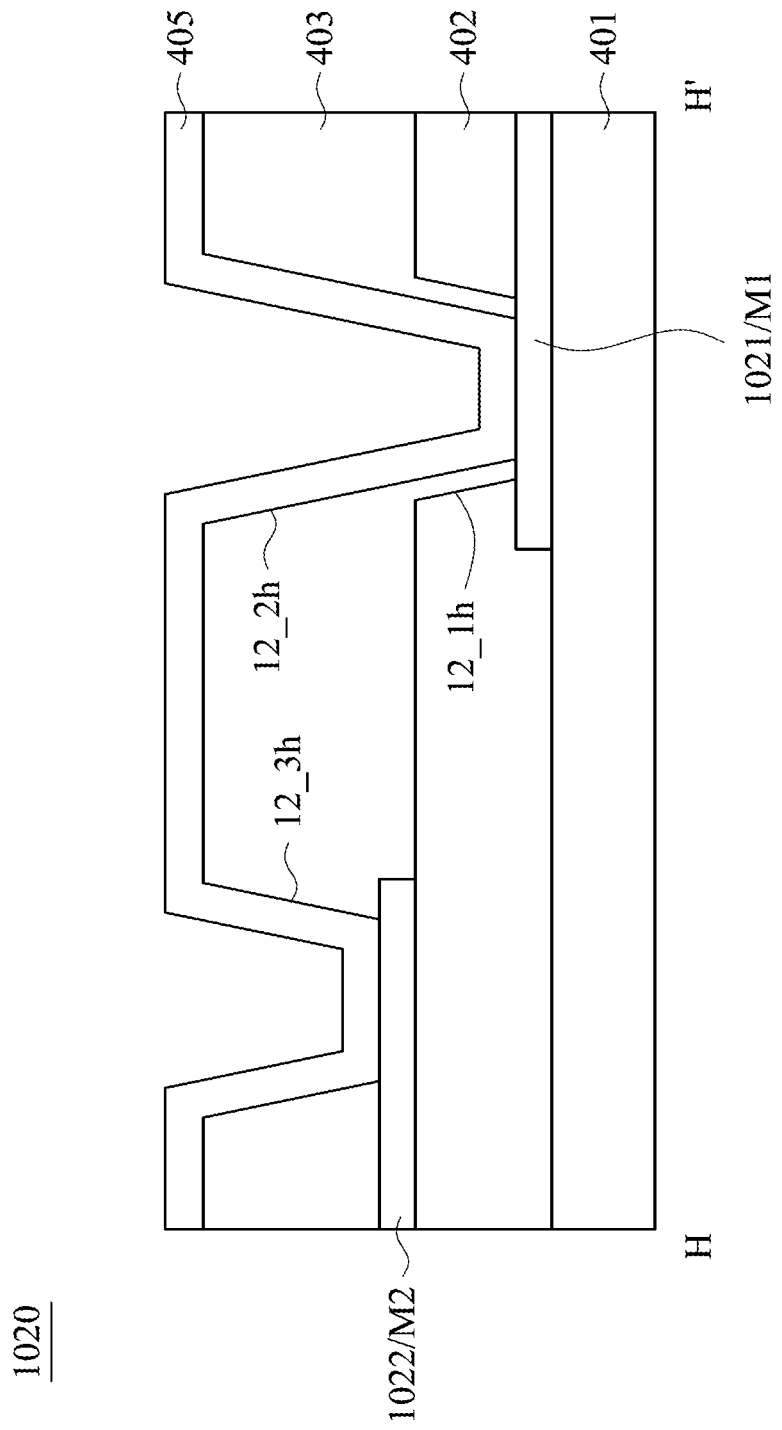
FIG. 16 is a cross-sectional view of a connection structure 1020 along a cross-sectional line HH' of FIG. 14.

Referring to FIG. 16, FIG. 16 is a cross-sectional view of a connection structure 1020 along a cross-sectional line HH' of FIG. 14. The first part 1021 formed in the first metal layer M1 is disposed on the substrate 401. The first insulation layer 402 is disposed on the first metal layer M1 and has a first opening 12_1h to expose the first part 1021. The second part 1022 formed in the second metal layer M2 is disposed on the first insulation layer 402. The second insulation layer 403 is disposed on the second metal layer M2, and has a second opening 12_2h corresponding to the first opening 12_1h, and a third opening 12_3h to expose the second part 1022. The transparent conductive layer 405 is disposed on the second insulation layer 403, and is electrically connected to the second part 1022 through the third opening 12_3h, and is electrically connected to the first part 1021 through the second opening 12_2h.

Figure 17:
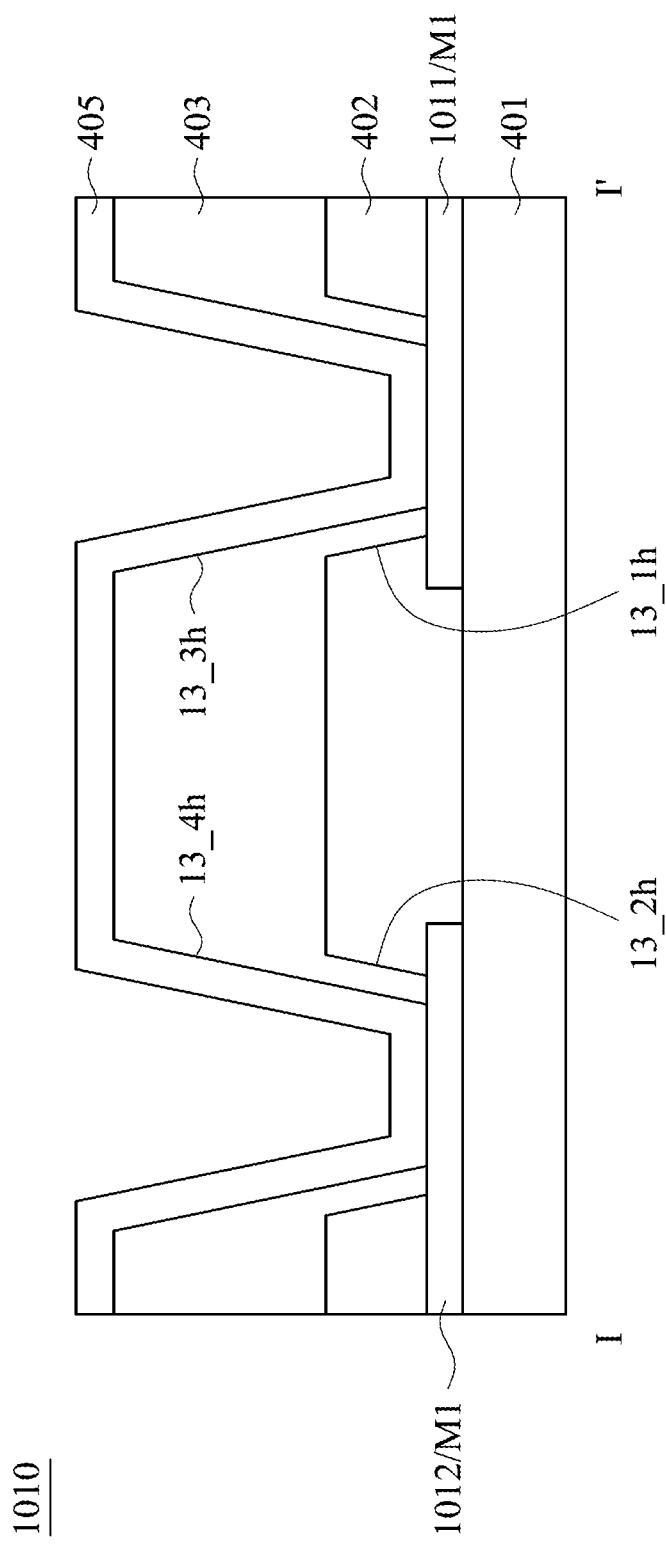
FIG. 17 is a cross-sectional view of the connection structure 1010 along a cross-sectional line II' of FIG. 14.

FIG. 17 is a cross-sectional view of the connection structure 1010 along a cross-sectional line II' of FIG. 14. Referring to 17, the first part 1011 and the second part 1012 formed in the first metal layer M1 are disposed on the first insulation layer 402. The first insulation layer 402 is disposed on the first metal layer M1, and has a first opening 13_1h to expose the first part 1011, and a second opening 13_2h to expose the second part 1012. The second insulation layer 403 is disposed on the first insulation layer 402, and has a third opening 13_3h corresponding to the first opening 13_1h, and has a fourth opening 13_4h corresponding to the second opening 13_2h. The transparent conductive layer 405 is disposed on the second insulation layer 403, and is electrically connected to the first part 1011 through the third opening 13_3h, and is electrically connected to the second part 1012 through the fourth opening 13_4h.

Referring to FIG. 14, although both of the first part 1011 and the second part 1012 are formed in the first metal layer M1, the connection structure 1010 makes the resistance of the second signal line 142 match with that of the third signal line 143 due to the reasons similar to FIG. 9-11. It is worth mentioning that the third signal line 143 is transferred from the first metal layer M1 to the second metal layer M2 in FIG. 14 so as to reduce the spacing between the third signal line 143 and the adjacent second signal line 142 in the non-display area 120. However, in other embodiments, the second signal line 142 may be transferred from the first metal layer M1 to the second metal layer M2 through a connection structure similar to the connection structure 1020, and the third signal line 143 is maintained in the first metal layer M1, and different parts of the third signal line 143 in the non-display area 120 are electrically connected through a connection structure similar to the connection structure 1010.

Figure 18:
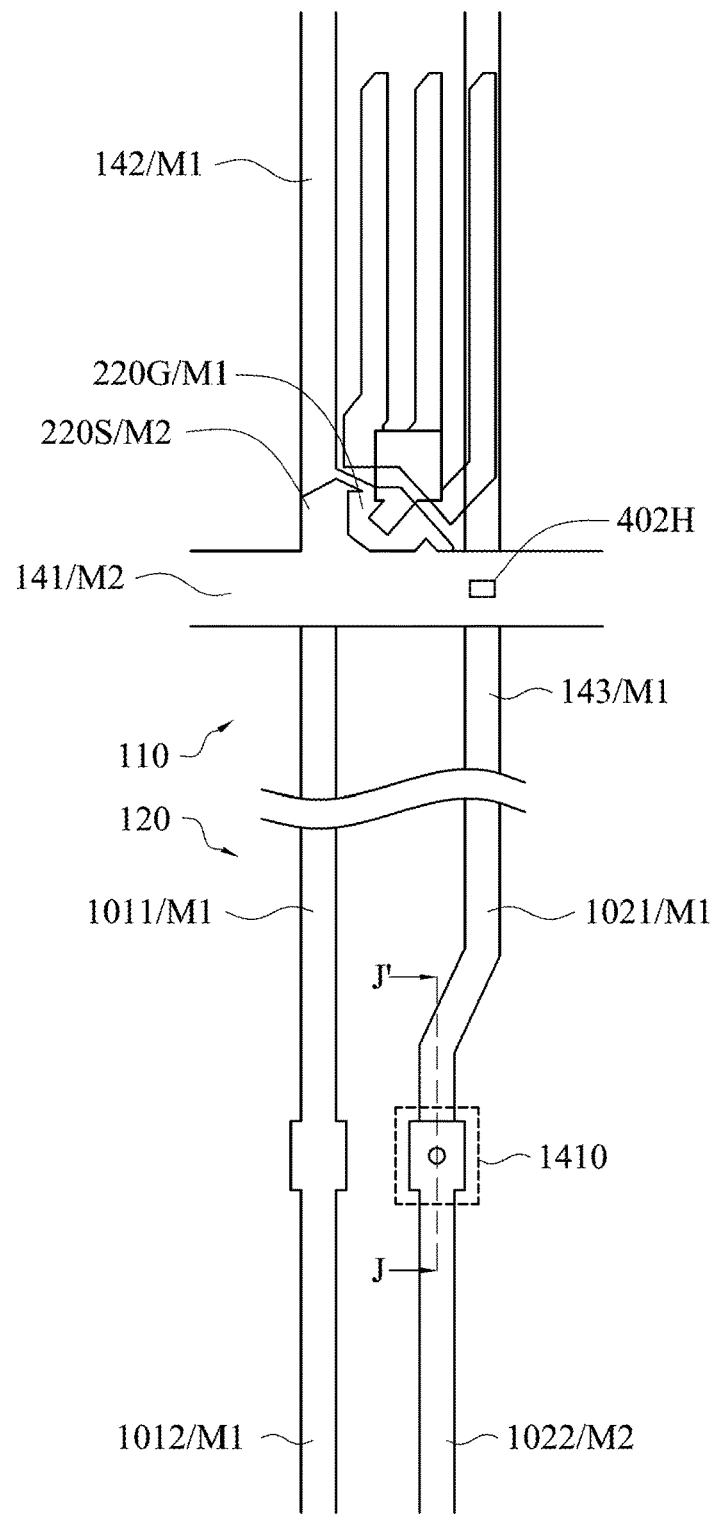
FIG. 18 is a top view of a pixel structure according to an embodiment.
Figure 19:
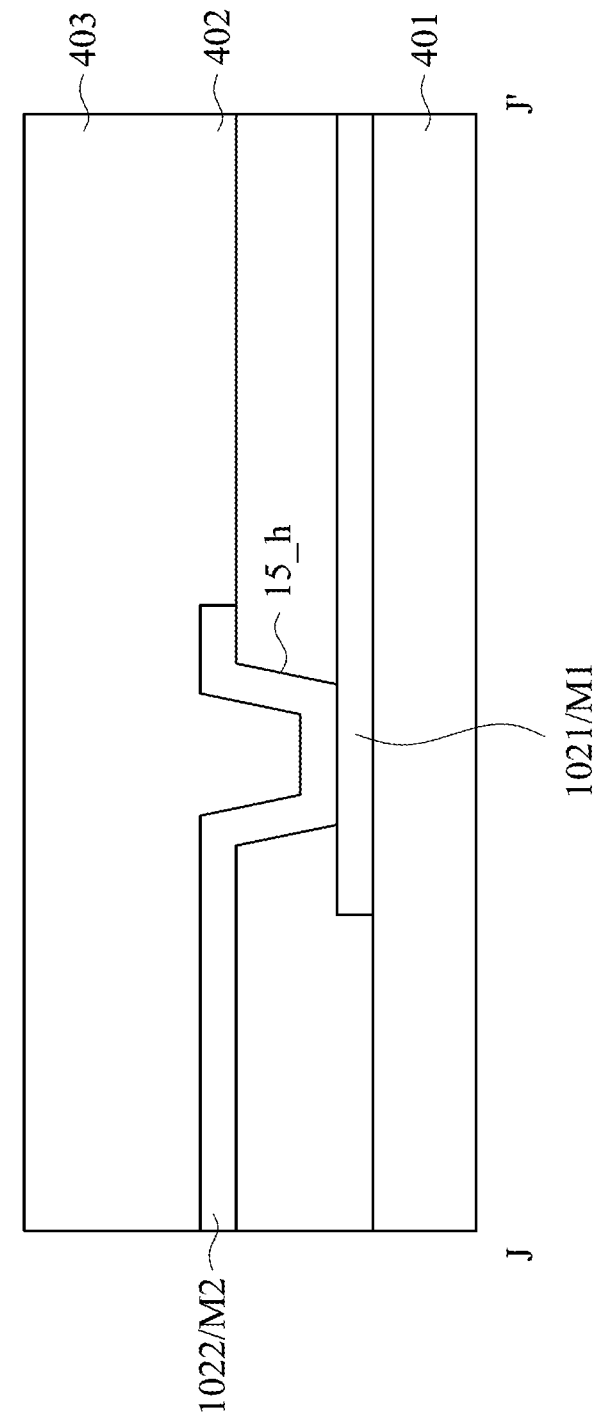
FIG. 19 is a cross-sectional view of a connection structure 1410 along a cross-sectional line JJ' of FIG. 18.

Referring to FIG. 18, FIG. 18 is similar to FIG. 14, and similar or identical units will not be described or labeled again. In FIG. 18, both of the first part 1011 and the second part 1012 of the second signal line 142 are formed in the first metal layer M1. However, the first part 1021 of the third signal line 143 is formed in the first metal layer M1, and the second part 1022 is formed in the second metal layer M2. The connection structure 1410 is used to electrically connect the first part 1021 and the second part 1022. To be specific, referring to FIG. 19, FIG. 19 is a cross-sectional view of a connection structure 1410 along a cross-sectional line JJ' of FIG. 18. The first part 1021 is disposed on the substrate 401. The first insulation layer 402 is disposed on the first metal layer M1, and has an opening 15_h to expose the first part 1021. The second part 1022 formed in the second metal layer M2 is disposed on the first insulation layer 402, and is electrically connected to the first part 1021 through the opening 15_h.

Similar to embodiments of FIG. 12 and FIG. 13, the resistance of the connection structure 1410 is very small, and therefore, the first part 1011 and the second part 1012 of the second signal line 142 are directly connected to the each other in the embodiment with no need to additionally dispose a connection structure between the first part 1011 and the second part 1012 of the second signal line 142.

In the embodiment of FIG. 18, the third signal line 143 is transferred from the first metal layer M1 to the second metal layer M2, but the second signal line 142 may be transferred from the first metal layer M1 to the second metal layer M2 in other embodiments. In other words, a connection structure similar to the connection structure 1410 may be disposed on the second signal line 142.

Note that in the embodiments of FIG. 9-19, adjacent second signal line 142 and third signal line 143 are taken as an example, but the invention is not limited thereto. In some embodiments, one third signal line 143 is disposed for multiple second signal lines 142, and the embodiments of FIG. 9-19 may be applied to two adjacent second signal line 142 to reduce the spacing between adjacent signal lines in the non-display area 120.

Figure 20:
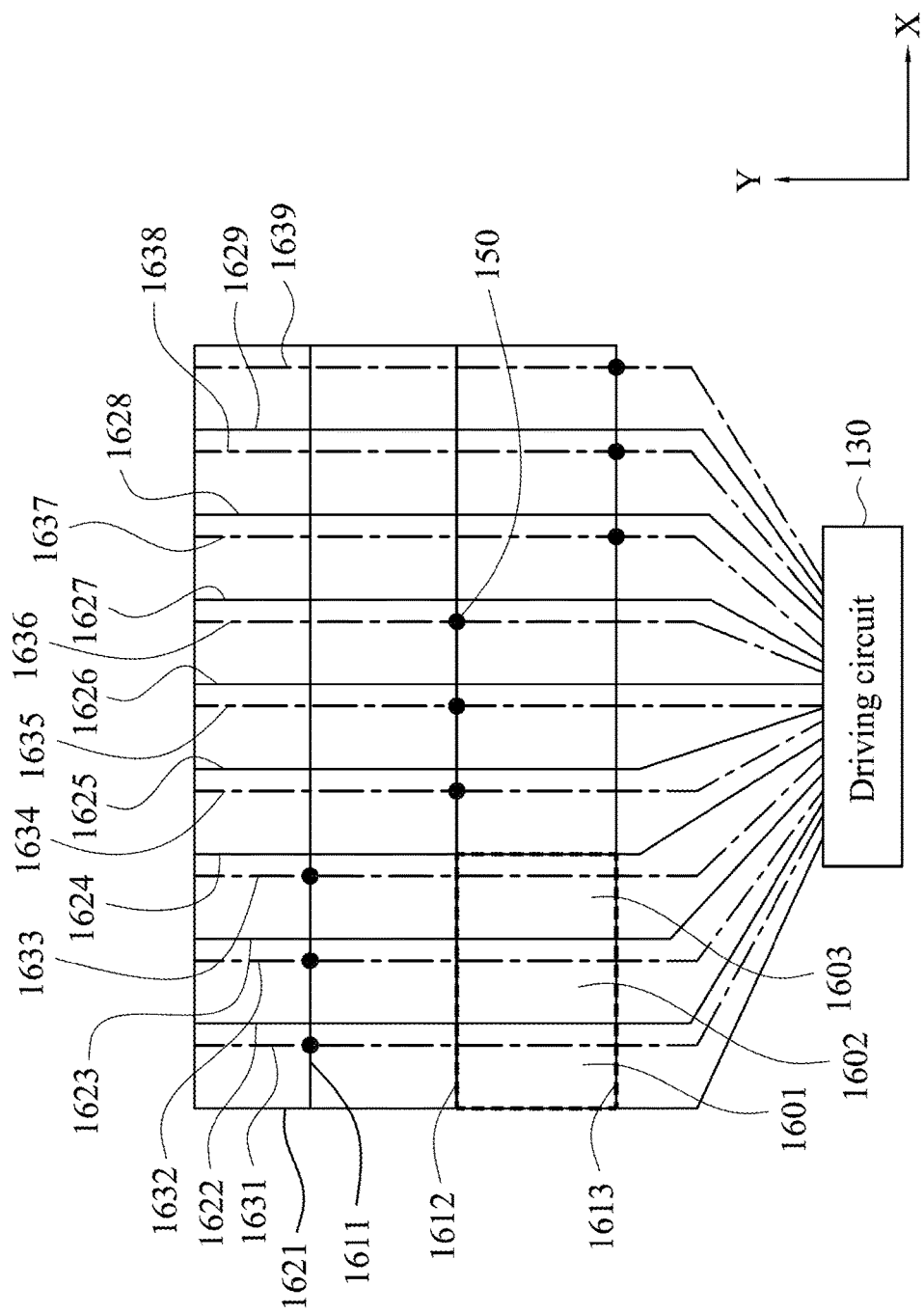
FIGS. 20 and 21 are schematic diagrams illustrating the first signal lines and the third signal lines according to an embodiment.

FIG. 20 is a schematic diagram illustrating the first signal lines and the third signal lines according to an embodiment. FIG. 20 shows a colorful display panel with resolution of 3×3. The pixel structures 1601, 1602 and 1603 are respectively sub-pixel corresponding to red, green and blue colors. And, the pixel structures 1601, 1602 and 1603 (i.e. sub-pixels) of red, green and blue constitute a pixel. Accordingly, the pixel structures in the display panel of FIG. 19 are arranged as three rows and nine columns. For the sake of simplification, first signal lines 1611-1613, second signal lines 1621-1629, third signal lines 1631-1639 and connection points 150 are illustrated in the embodiment of FIG. 20, and other units are not illustrated. Because the display panel includes three first signal lines 1611-1613, generally three third signal lines are required to be electrically connected to the corresponding first signal lines 1611-1613 respectively through the connection points 150 so that driving signals from the driving circuit 130 are able to be transmitted to the corresponding first signal lines 1611-1613. However, the third signal lines in the pixel structures would affect the aperture ratio of the pixel structures, and therefore one third signal line is disposed for each pixel structure column to produce consistent aperture ratio in each pixel structure and to reduce the resistance for a signal transmitted from the driving circuit 130 to the corresponding first signal line. That is, one third signal line would extend through each pixel region in each column of pixel regions. Accordingly, the number of the third signal lines 1631-1639 is three times of the number of the first signal lines 1611-1613. For example, in FIG. 20, the pixel regions defined by the intersections of the first signal lines 1611-1613 and the second signal lines 1621-1629 are arranged as a matrix with nine columns and three rows. Each column of pixel regions has one third signal extending therethrough, and each third signal line extend through each pixel region in the corresponding column of pixel regions. In other words, when viewed from a direction perpendicular to the top surface of the first substrate 401, each third signal line overlaps with each pixel region in the corresponding column. In the embodiment of FIG. 20, each first signal line 1611-1613 is electrically connected to three third signal lines. In detail, the first signal line 1611 is electrically connected to the third signal lines 1631-1633, the first signal line 1612 is electrically connected to the third signal lines 1634-1636, and the first signal line 1613 is electrically connected to the third signal lines 1637-1639. As a result, the resistance between the first signal lines 1611-1613 and the driving circuit 130 is reduced. However, in other embodiments, each column of pixel regions has one third signal line disposed therein, and each first signal line 1611-1613 may be electrically connected to one or two of the third signal lines 1631-1639, in which the third signal lines 1631-1639 not electrically connected to the first signal lines 1611-1613 may be spare or has other usages so that each pixel structure has identical aperture ratio. For example, three pixel columns on the left of FIG. 20 respectively have third signal lines 1631, 1632 and 1633. The first signal line 1611 may be coupled to the third signal line 1631 but not coupled to the third signal lines 1632 and 1633, or the first signal line 1611 may be coupled to the third signal lines 1631 and 1632 but not coupled to the third signal line 1633. That is to say, each of the first signal lines 1611-1613 is electrically connected to the driving circuit 130 through at least one of the third signal lines 1631-1639.

Figure 21:
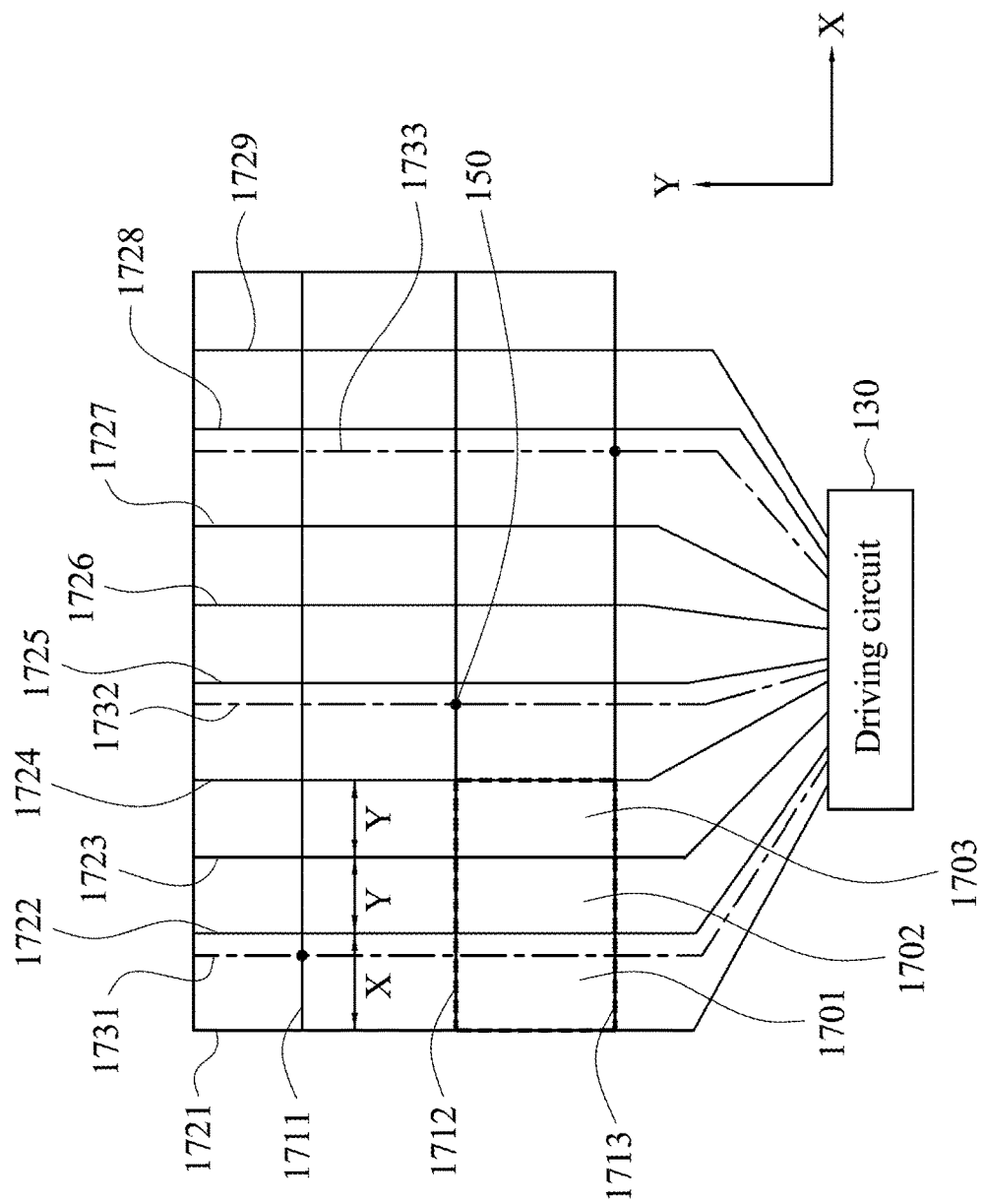

In the embodiment of FIG. 20, each pixel structure has identical area, and each pixel structure has one of the third signal lines 1631-1639. That is, the area of each pixel region is identical to each other, and each pixel region has one third signal line extending therethrough. However, in other embodiments, the varieties may include that one of three adjacent pixel structures has larger area and includes the third signal line while the other two pixel structures have smaller area and do not include the third signal line. Therefore, the larger area of the pixel structure may compensate the loss of aperture ratio caused by the third signal line. Referring to FIG. 21, in the embodiment of FIG. 21, there are first signal lines 1711-1713, second signal lines 1721-1729 and third signal lines 1731-1733. The pixel structures having the third signal line has larger width X, and the pixel structures not having the third signal line have small width Y. That is, the area of the pixel region through which the third signal line extends is larger than the area of the pixel region through which no third signal line extends. For example, the pixel structures 1701-1703 are arranged along X axis and are adjacent to each other. The pixel structure 1701 has the third signal line 1731, but the pixel structures 1702 and 1703 do not have the third signal line. The width X (i.e. the length along X axis) of the pixel structure 1701 (also referred to a first pixel structure) is greater than the width Y of the pixel structure 1702 (also referred to a second pixel structure) and the pixel structure 1703 (also referred to a third pixel structure). Since the heights (i.e. the length along Y axis) of the pixel structures 1701-1703 are the same, the area of the pixel structure 1701 is larger than that of the pixel structure 1702, and also larger than that of the pixel structure 1703. The area of the pixel structure 1701 may be n times of the pixel structures 1702 and 1703, where n may be any real number greater than 1.

Note that in other embodiments, the display panel may be designed so that the area of the pixel region having third signal line extending therethrough is identical to the area of the pixel region not having third signal line extending therethrough. For example, the third signal line may be disposed in the area covered by a mask layer (e.g. black matrix layer), and thus the aperture rate of the pixel structure having third signal line is identical to that of the pixel structure not having third signal line. In addition, in some embodiments, because the area ratio of the third signal line to the pixel structure is small, thus the third signal line has small impact to the aperture ratio of the pixel structure, and the layout of the pixel structures may be simplified. For example, in the embodiment of FIG. 20, each column of pixel regions has one third signal line extending therethrough, and each third signal line extends through every pixel region in the corresponding column of pixel regions. However, the invention is not limited thereto. In other embodiments, each column of pixel regions has one third signal line extending therethrough, and at least one third signal line does not extend every pixel region in the corresponding column of pixel regions. In other words, in the display panel of the invention, the pixel regions are arranged as a plurality of columns and a plurality of rows, and each of the third signal lines extends through at least one pixel region in one of the columns.

As mentioned above, the panel may be designed as each pixel region having a third signal line disposed therein, or designed as part of pixel regions having third signal lines disposed therein while another part of pixel regions not having third signal lines disposed therein. In other words, each of at least one of the pixel regions has a third signal line disposed therein, or each of at least one of the pixel regions has a third signal line extending therethrough, In addition, each first signal line is electrically connected to at least one third signal line so as to electrically connect to the driving circuit through the at least one third signal line. That is, in the invention, multiple pixel regions are defined by intersections of the first signal lines and the second signal lines, in which multiple third signal lines are disposed in at least part of the pixel regions, and each first signal line is electrically connected to at least one of the third signal lines so that the first signal lines are electrically connected to the driving circuit through the third signal lines. Accordingly, the route of the first signal lines in the non-display area is reduced, and a narrow border is achieved.

Figure 22A:
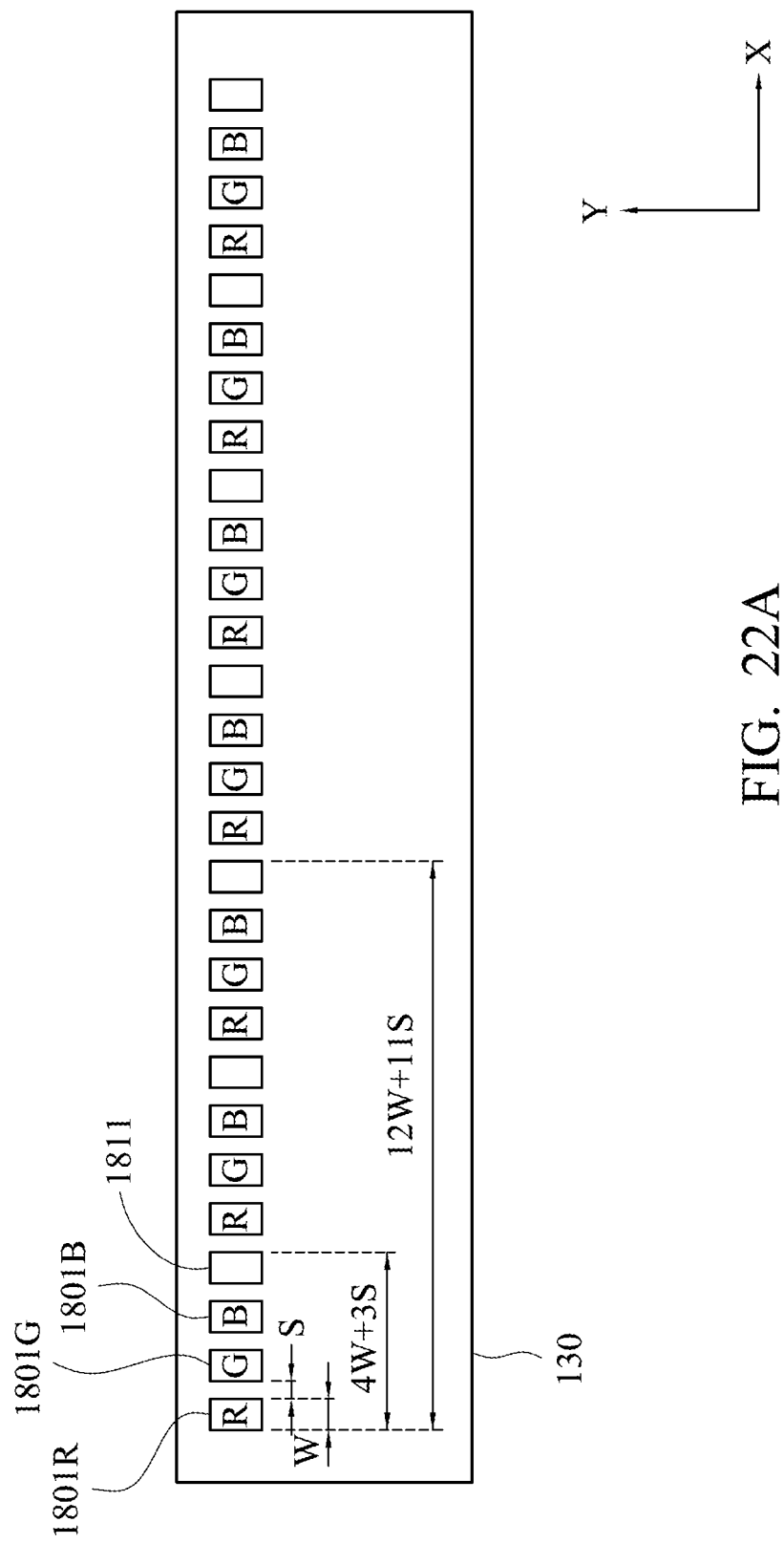
FIG. 22A is a schematic diagram illustrating configuration of pads on the driving circuit according to an embodiment.
Figure 22B:
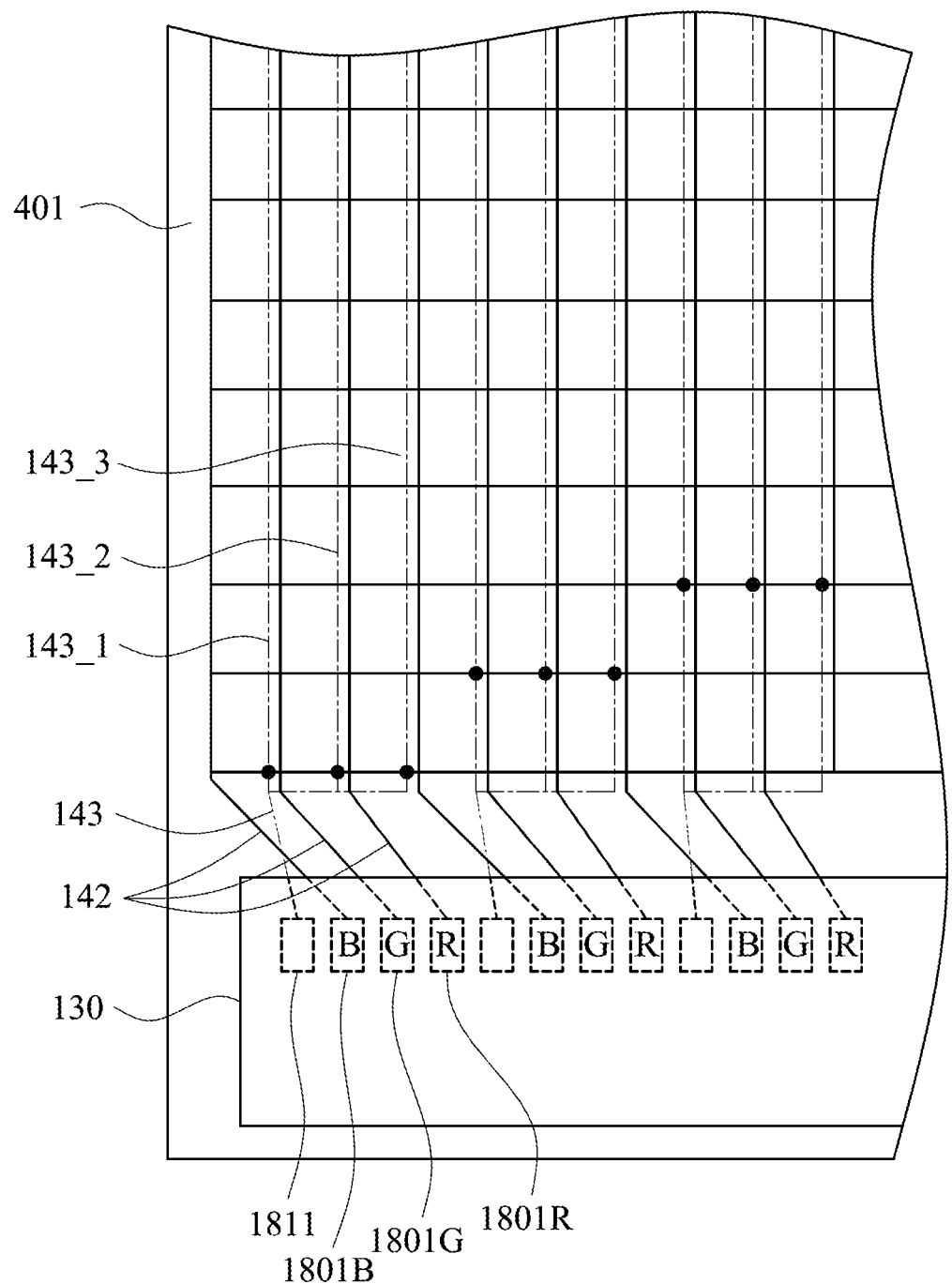
FIG. 22B is a top view of the display panel with driving circuit of FIG. 22A.

FIG. 22A is a schematic diagram illustrating configuration of pads on the driving circuit according to an embodiment, FIG. 22B is a top view of the display panel with driving circuit of FIG. 22A. In the embodiment, the driving circuit 130 is implemented into a chip including a gate driving circuit and a source driving circuit. The driving circuit 130 is disposed on the first substrate 401 of the display by a way of Chip on Glass (COG). That is, the chip is flipped so that pads of the driving circuit 130 face the first substrate 401, and the pads of the driving circuit 130 are electrically connected to bonding pads of the display panel in the non-display area through conductive adhesives (e.g. Anisotropic Conductive Film (ACF)). The driving circuit 130 includes first pads 1801R, 1801G and 1801B and second pads 1811. The character shown in the first pads 1801R, 1801G and 1801B represent the colors corresponding to the pixel structures ("R" means red, "G" means greed, and "B" means blue). The second signal lines 142 extend toward the non-display area to couple to the corresponding bonding pads (not shown) so that they are electrically connected to the pads 1801R, 1801G and 1801B in the driving circuit 130. As shown in FIG. 22A and FIG. 22B, three third signal lines 143_1, 143_2 and 143_3 in the display area are coupled to each other as a third signal line 143 in the non-display area, and the third signal line 143 extends toward the driving circuit 130 to electrically connect to the second pad 1811. As shown in FIG. 22B, because three third signal lines 143_1, 143_2 and 143_3 are coupled to each other as one third signal line 143 in the non-display area for extending toward the driving circuit 130, the third signal lines 143 and the second signal lines 142 intersect at several points in the non-display area. In order to avoid a short circuit between the third signal lines 143 and the second signal line 142, the connection structures in the embodiments of FIG. 9-FIG. 19 may be applied to the embodiment of FIG. 22B. Therefore, the third signal lines and the second signal lines located at the intersect points are formed in different metal layers, and thus the short circuit is avoided. In the embodiment, the embodiment of FIG. 20 is adopted for the configuration of the third signal lines in the display area adopts, and three third signal lines 143_1, 143_2 and 143_3 are coupled to each other in the non-display area and then extend toward the driving circuit 130. However, the invention is not limited thereto. In other embodiments, the embodiment of FIG. 21 is adopted for the configuration of the third signal lines in the display area. In addition, the ratio between the numbers of the first pads and the second pads is not limited in the invention.

The first pads 1801R, 1801G and 1803B are electrically connected to the second signal lines 142 respectively. The second pads 1811 are electrically connected to the third signal lines 143. In the embodiment, all of the first pads 1801R, 1801G and 1801B and the second pads 1811 are arranged along X axis (also referred to a first direction), and a straight line defined by central points of the first pads 1801R, 1801G and 1801B and the second pads 1811 is parallel with X axis. As shown in FIG. 22A, the first pads 1801R, 1801G and 1801B and the second pads 1811 have width W, and there are gaps S between the pads. Therefore, each set of pad (i.e. 1801R, 1801G, 1801B and 1811) has a length 4 W+3 S along X axis. Take three sets of pad as an example, the three sets have length (12 W+11 S) along X axis.

Figure 23:
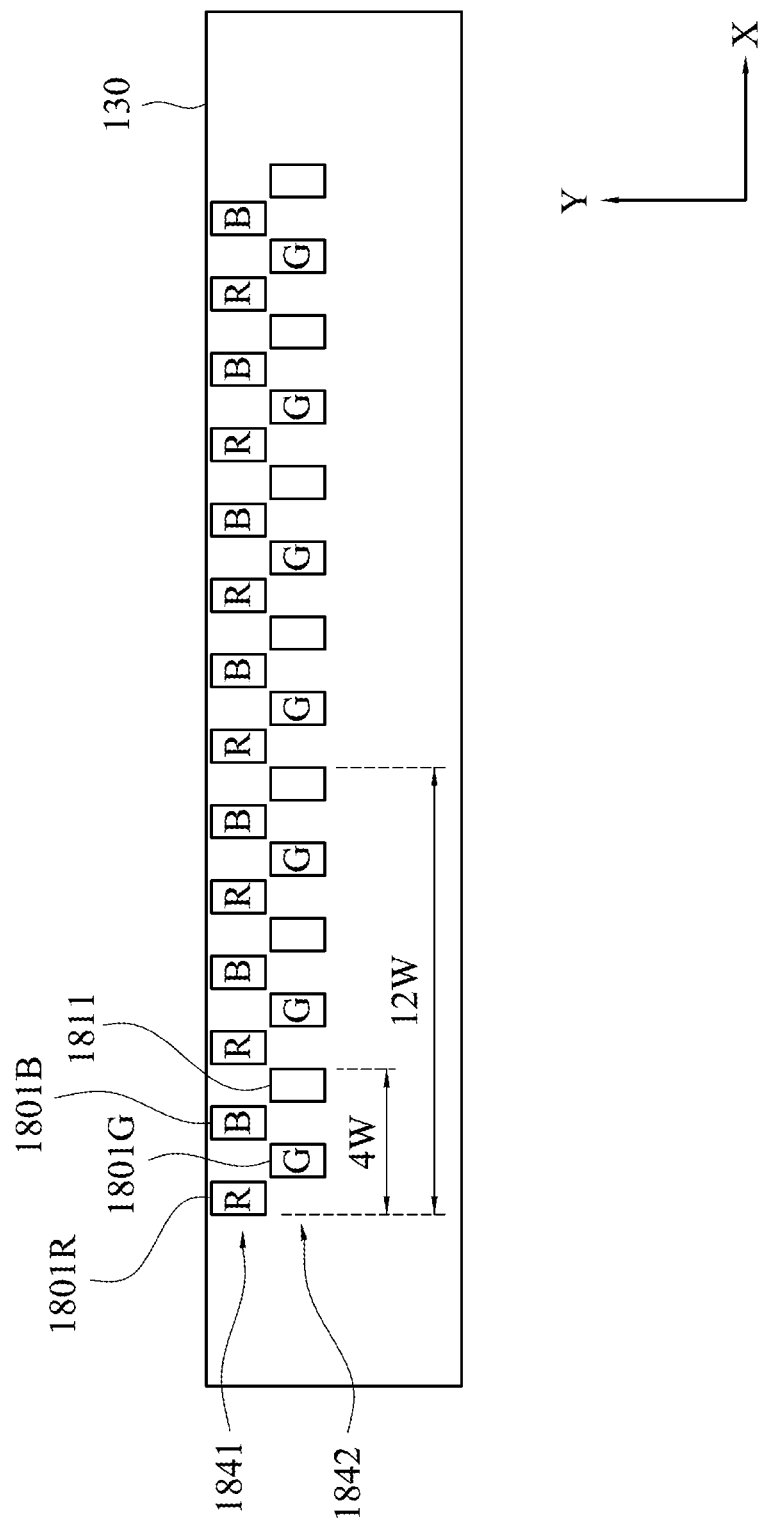
FIG. 23 is a schematic diagram illustrating configuration of the pads in the driving circuit according to another embodiment.

FIG. 23 is a schematic diagram illustrating configuration of the pads in the driving circuit according to another embodiment. In FIG. 23, all of the pads are arranged along Y axis (also referred to second direction) as a first row 1841 and a second row 1842. The first row 1841 includes the first pads 1801R and 1801B which are arranged along X axis (also referred to first direction) as 1801R, 1801B, 1801R, 1801B, 1801R, 1801B, and so on. The second row 1842 includes the first pad 1801G and the second pad 1811 which are arranged along X axis as 1801G, 1811, 1801G, 1811, 1801G, 1811, and so on. In other words, the first row 1841 only includes part (e.g. first pads 1801R and 1801B) of the first pads 1801R, 1801B and 1801R, the second row 1842 include another part (e.g. first pad 1801G) of the first pads 1801R, 1801B and 1801R and the second pad 1811. In the second row 1842, one first pad 1811 is disposed between two adjacent second pads 1801G. In the first row 1841, a straight line defined by central points of the first pad 1801R and 1801B is parallel with X axis; in the second row 1842, another straight defined by central points of the first pads 1801G and the second pads 1811 is also parallel with X axis; and the two straight lines are parallel with the each other. The first pads 1801R, 1801G, 1801B and the second pads 1811 are interlacedly arranged along X axis in two rows, and thus line segments defined by central points of the first pads 1801R, 1801G 1801B and the second pad 1811 are zigzag polylines. Take five pads (i.e. 1801R-1801G-1801B-1803-1801R) on the left-hand side as examples, the lines segments defines by the central points of the five pads is a "W"-shape polyline. As shown in FIG. 23, the first pads 1801R, 1801G and 1801B and the second pads 1811 have widths W, and therefore each set of pad (i.e. 1801R, 1801G, 1801B and 1811) has length 4 W along X axis, and three sets of pad have length 12 W along X axis. The chip including the driving circuit would have smaller length along X axis in the embodiment, compared with the embodiment of FIG. 22A, when the number of the pads are the same. When the resolution of the panel gets greater, the number of the pads in the driving circuit 130 is increased significantly, causing that the size of the chip, which includes the driving circuit, is limited to the disposition of the pads instead of the size of the circuit. As a result, the chip gets larger when the number of the pads grows, and thus the cost of the chip is increased. However, the size of the chip is reduced significantly and the cost is reduced by adopting the disposition of the pads in FIG. 23 when the number of the pads remains the same.

Figure 24:
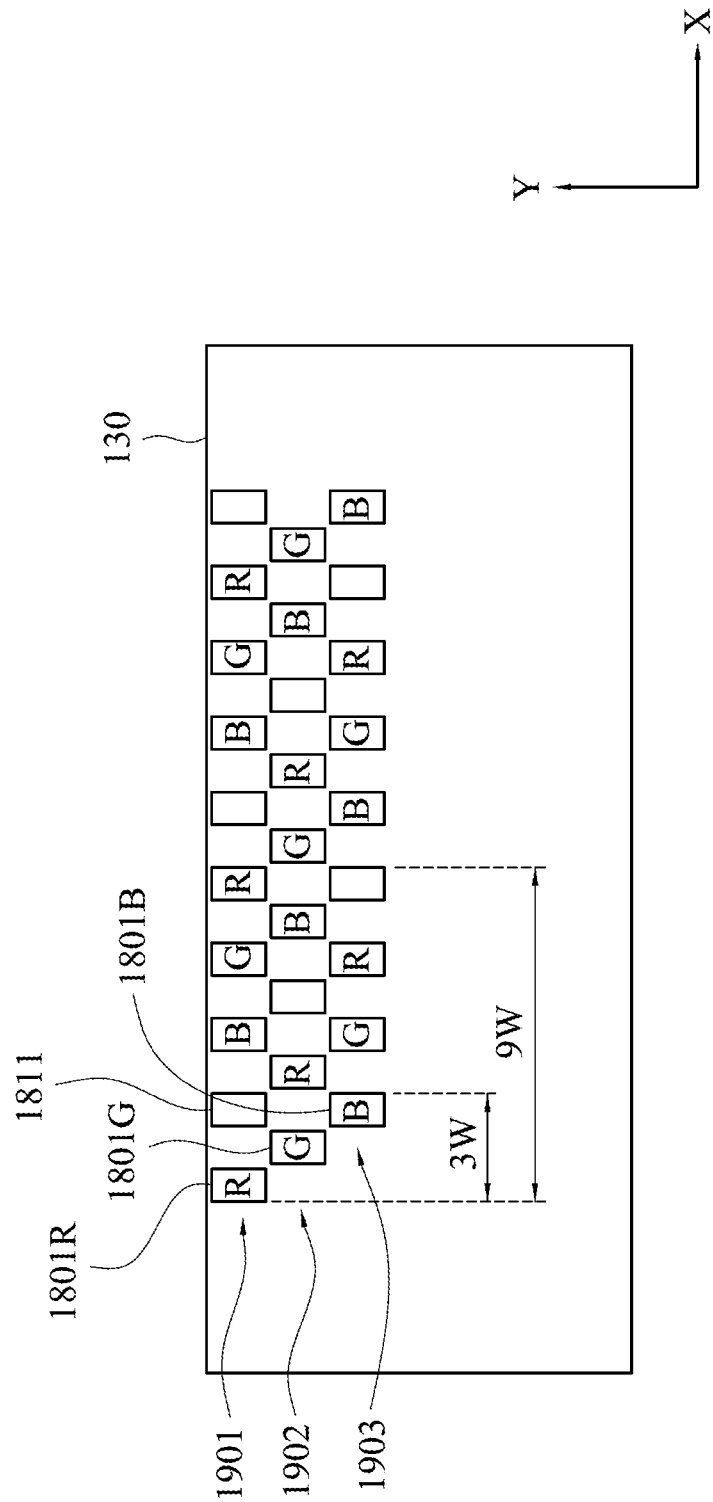
FIG. 24 is a schematic diagram illustrating configuration of the pads in the driving circuit according to another embodiment.

In other embodiments, the pads in the driving circuit 130 may be arranged as more or less rows, which is not limited in the invention. For example, FIG. 24 is a schematic diagram illustrating configuration of the pads in the driving circuit according to another embodiment. In FIG. 24, all of the first pads and the second pads are arranged along Y axis as a first row 1901, a second row 1902 and a third row 1903. Each row 1901-1903 includes part of the first pads and part of the second pads. As shown in FIG. 24, the pads in the first row 1901 are sequentially arranged along X axis as 1801R, 1811, 1801B, 1801G, 1801R, 1811, 1801B, 1801G, and so on. The pads in the second row 1901 are sequentially arranged along X axis as 1801G, 1801R, 1811, 1801B, 1801G, 1801R, 1811, 1801B, and so on. The pads in the third row 1901 are sequentially arranged along X axis as 1801B, 1801G, 1801R, 1811, 1801B, 1801G, 1801R, 1811, and so on. In other words, each one of the first row 1901, the second row 1902 and the third row 1903 includes part of the first pads and part of the second pads, and three first pads are disposed between two adjacent second pads in each row. A straight line defined by central points of all the pads in the first row is parallel with X axis; another straight line defined by central points of all the pads in the second row is parallel with X axis; yet another straight line defined by central points of all the pads in the third row is parallel with X axis; and the three straight lines are parallel with the each other. As shown in FIG. 24, each set of pad (i.e. 1801R, 1801G, 1801B and 1811) has pads overlapped with the each other along X axis. For example, the first pad 1801B is overlapped with the second pad 1811 along X axis in the set on the most left-hand side, and therefore each set of pad has length 3 W along X axis, and three sets have length 9 W along X axis.

Figure 25A:
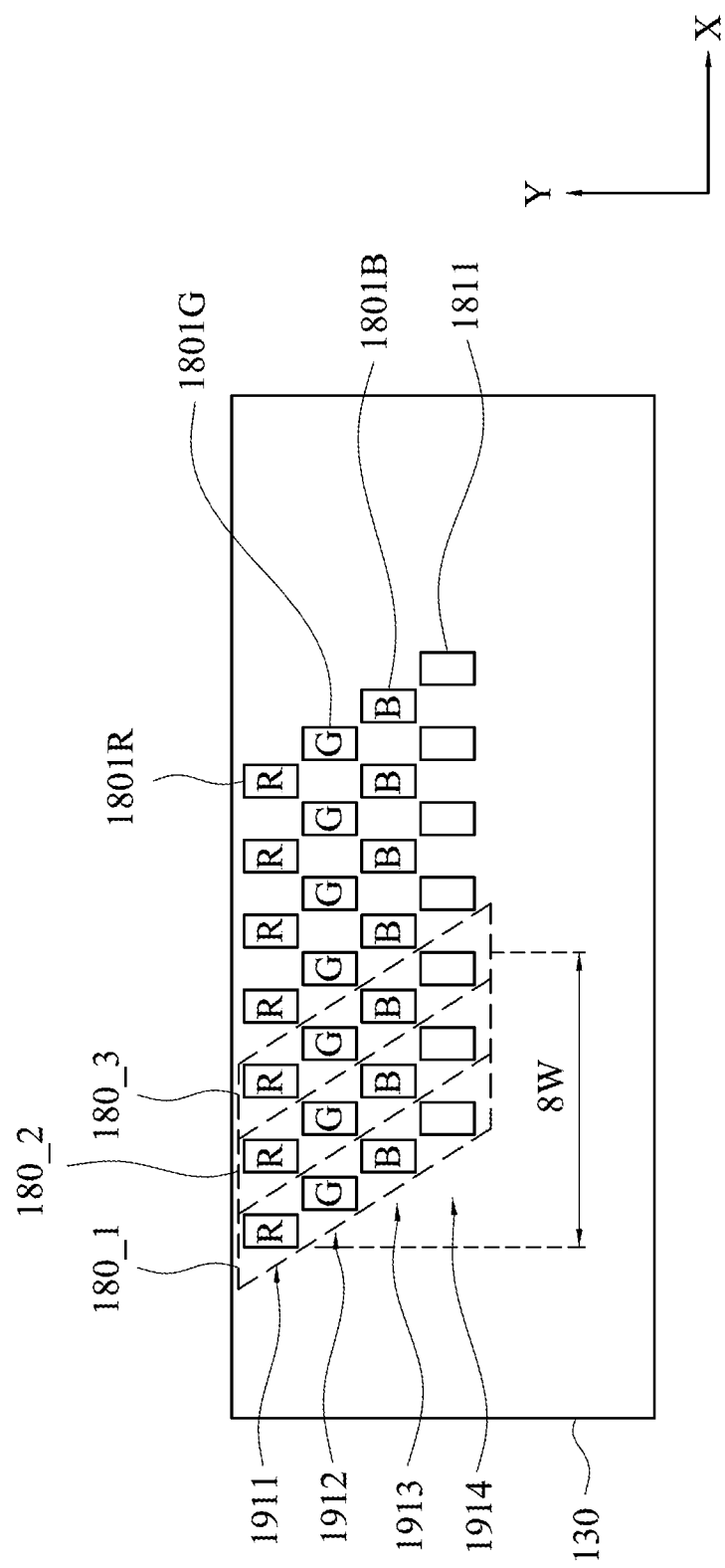
FIGS. 25A and 25B are schematic diagrams illustrating configuration of the pads in the driving circuit according to another embodiment.
Figure 25B:
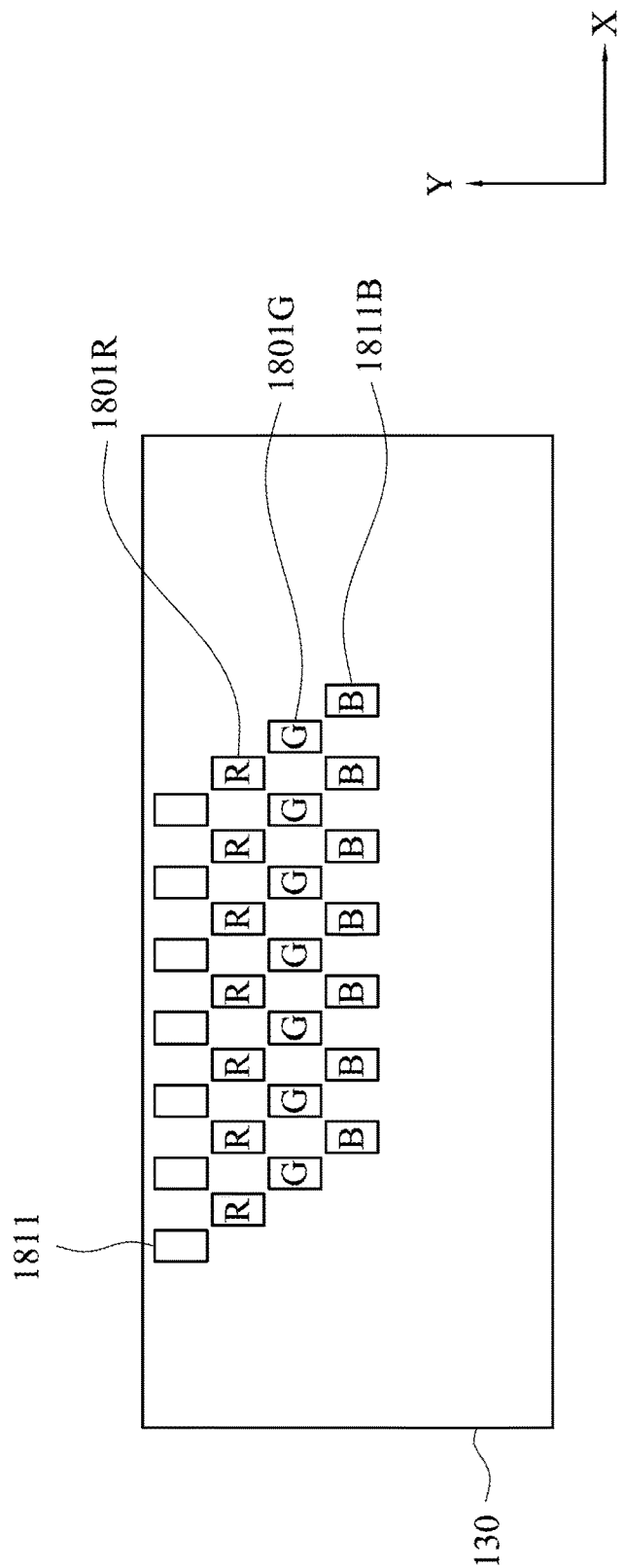
Figure 26A:
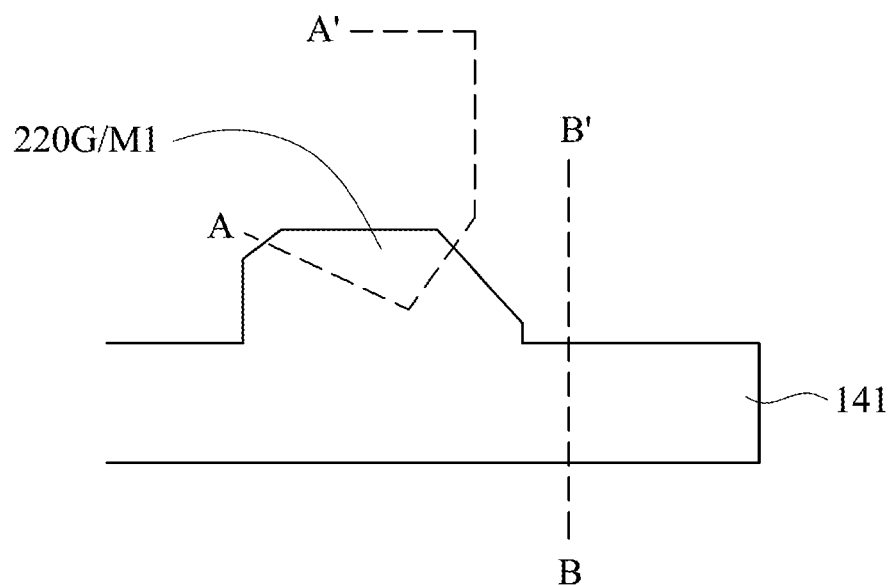
Figure 26B:
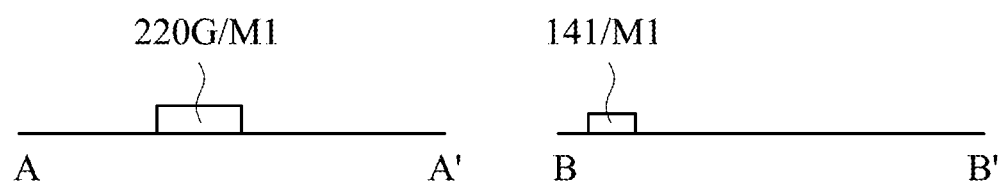
Figure 27A:
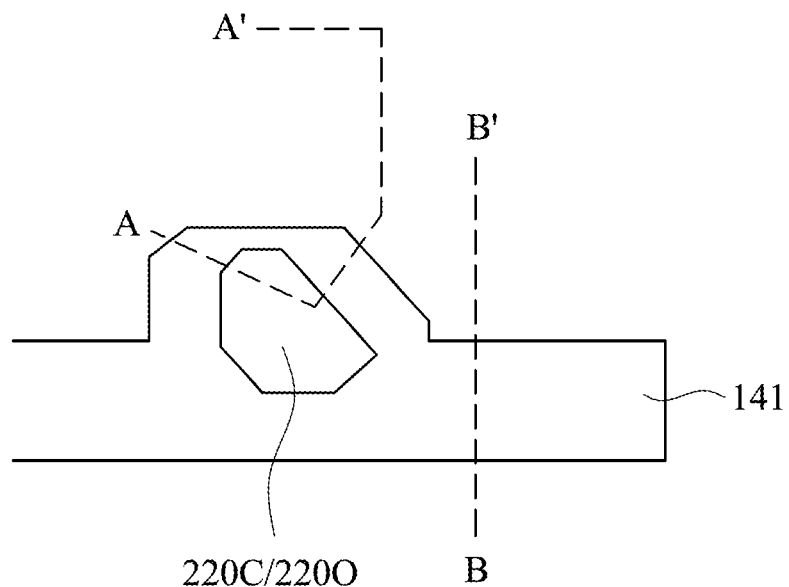
Figure 27B:
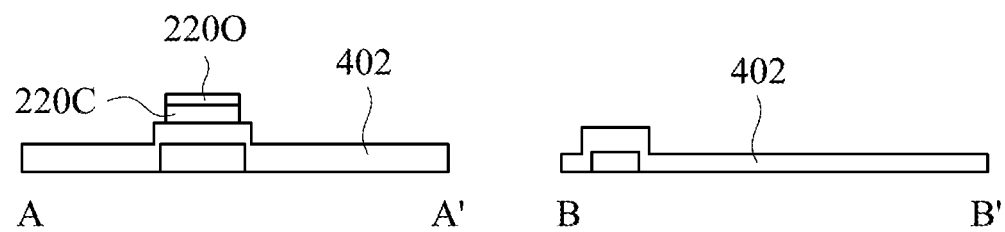
Figure 28A:
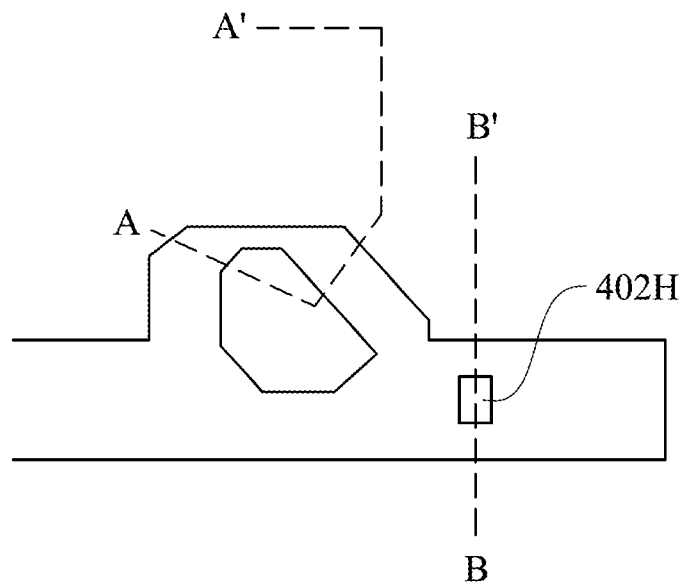
Figure 28B:
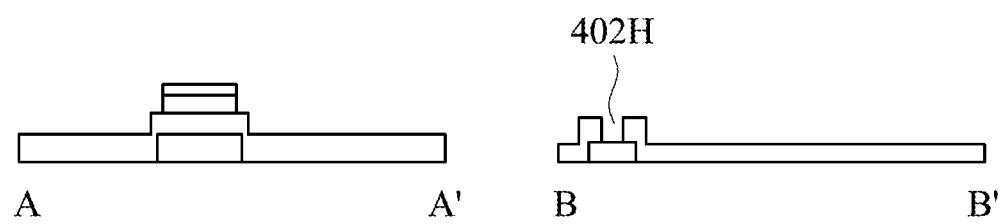
Figure 29A:
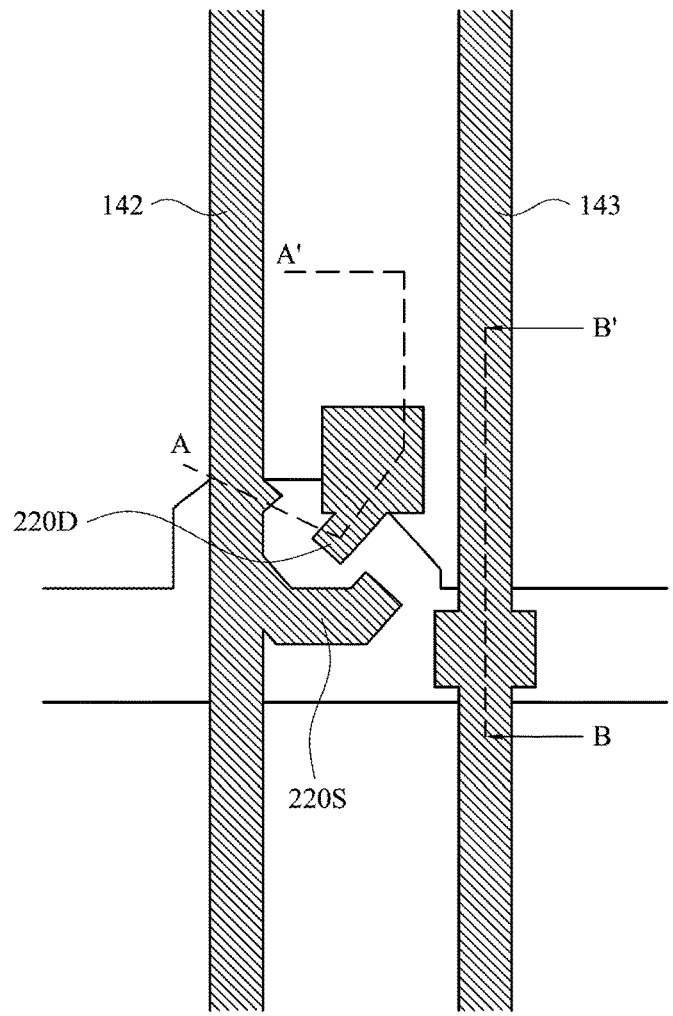
Figure 29B:
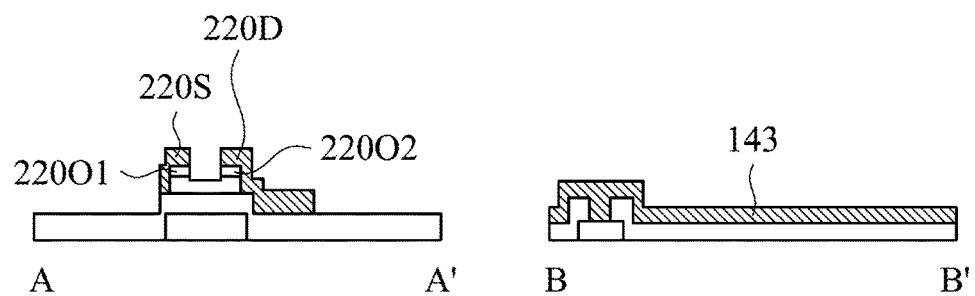
Figure 30A:
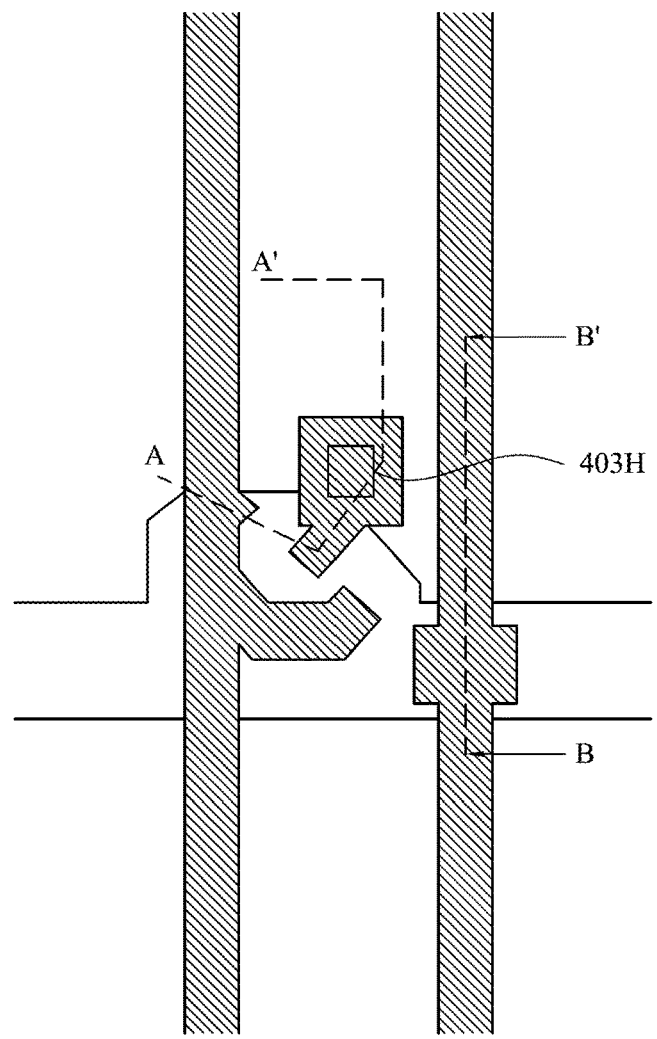
Figure 30B:
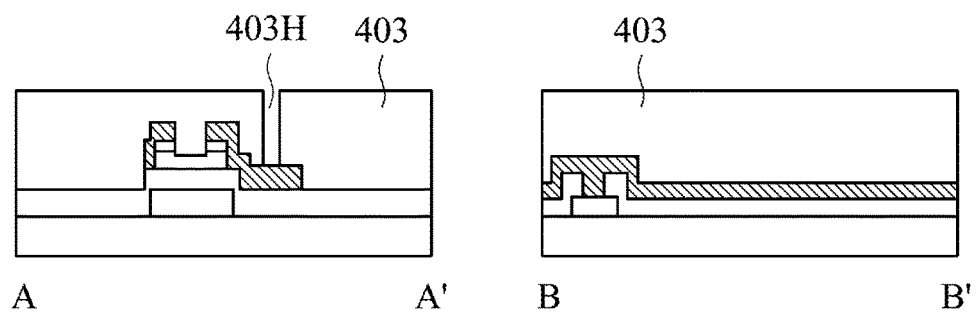
Figure 31A:
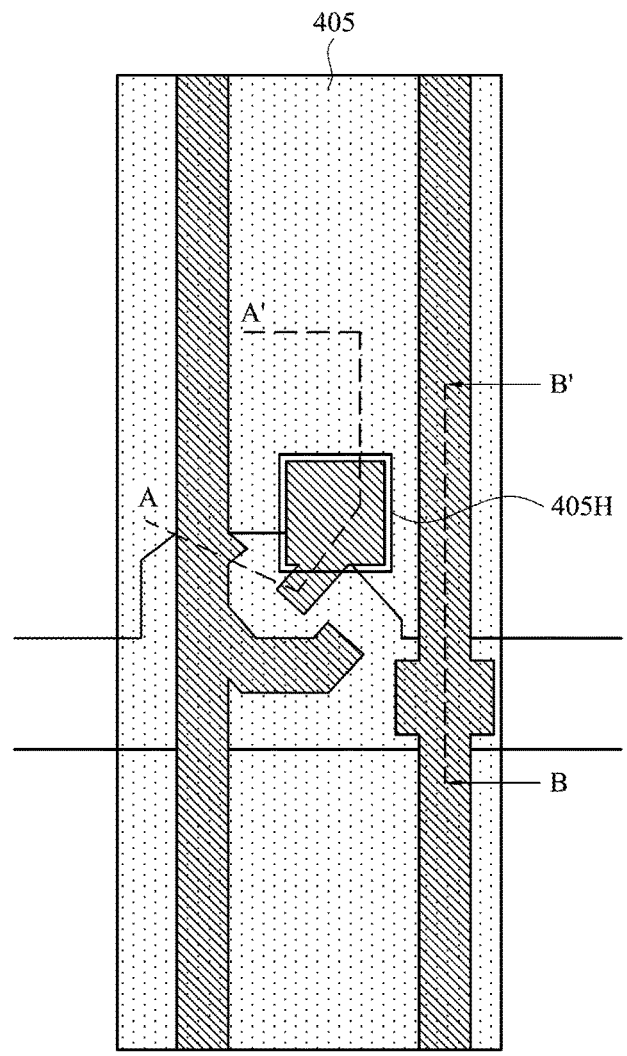
Figure 31B:
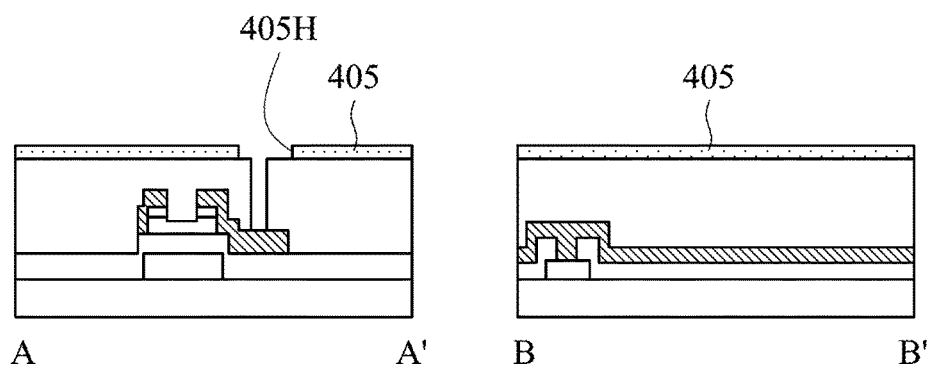
Figure 32A:
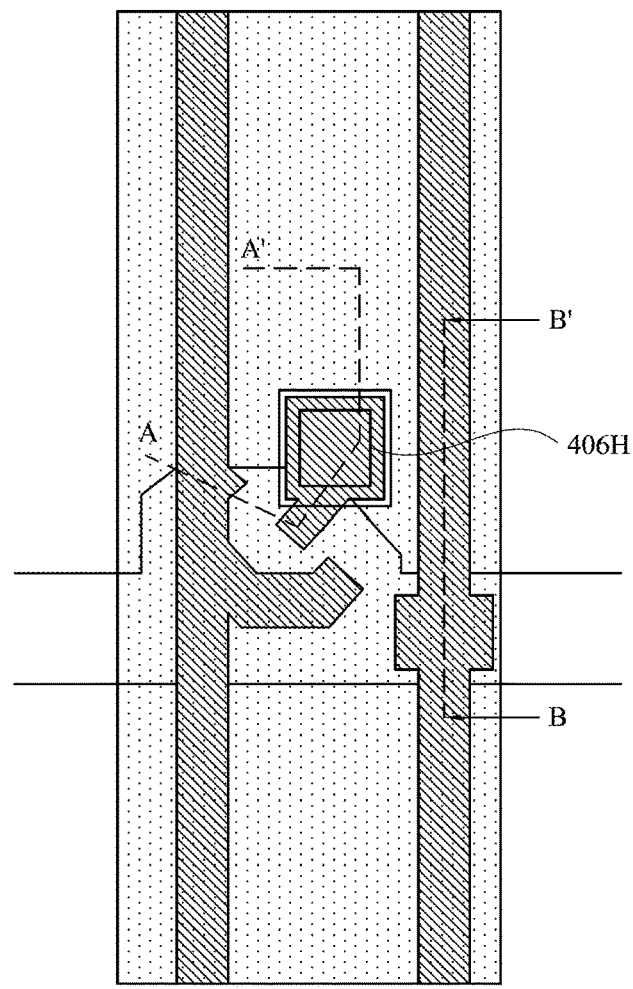
Figure 32B:
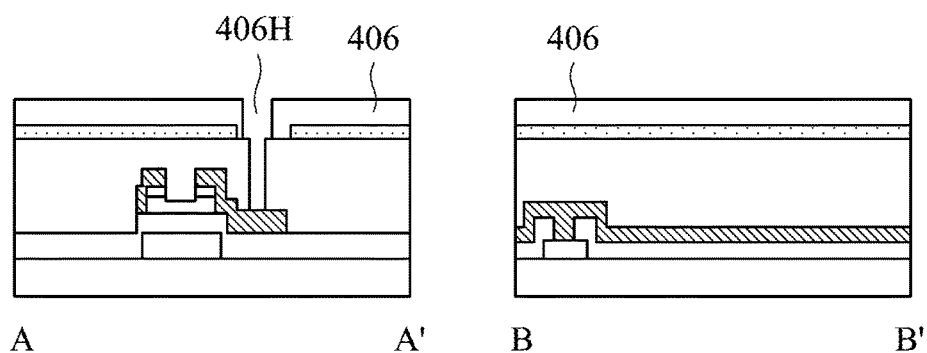

FIG. 25A is a schematic diagram illustrating configuration of the pads in the driving circuit according to another embodiment. In FIG. 25A, all of the first pads and the second pads are arranged along Y axis as a first row 1911, a second row 1912, a third row 1913 and a fourth row 1914. The first row 1911 only includes the first pads 1801R arranged along X axis. The second row 1912 only includes the first pads 1801G arranged along X axis. The third row 1913 only includes the first pads 1801B arranged along X axis. The fourth row 1914 only includes the second pads 1811 arranged along X axis. In other words, each of the first row 1911, the second row 1912 and the third row 1913 includes part of the first pads 1801R, 1801G and 1801B, and the fourth row 1914 only includes the second pads. The pixel structures corresponding to the first pads in the same row are corresponding to the same color. For example, all pads in the second row 1912 are corresponding to green, and so on. As shown in FIG. 25A, each set of pad (1801R, 1801G 1801B and 1811) has length 4 W along X axis. However, two adjacent sets of pad are overlapped with each other along X axis. For example, in a second set 180_2 marked with dashed line in FIG. 25A, the first pad 1801R and 1801G are overlapped with the first pad 1801B and the second pad 1811 in a first set pad 180_1 along X axis. In addition, the first pad 1801B and the second pad 1811 in the second set pad 180_2 are overlapped with the first pads 1801R and 1801G in a third set 180_3 along X axis. Therefore, the length of three sets of pad along X axis is reduced to 8 W. FIG. 25B is similar to FIG. 25A, but the second pads 1801R, 1801G, 1801B are disposed below the pad 1811, and the description thereof will not be repeated.

As mentioned above, the size of the chip including the driving circuit 130 may be reduced to lower the cost by adopting the disposition of the first pads 1801R, 1801G, 1801B and the second pads 1811 in FIG. 24, FIG. 25A and FIG. 25B.

Figure 33A:
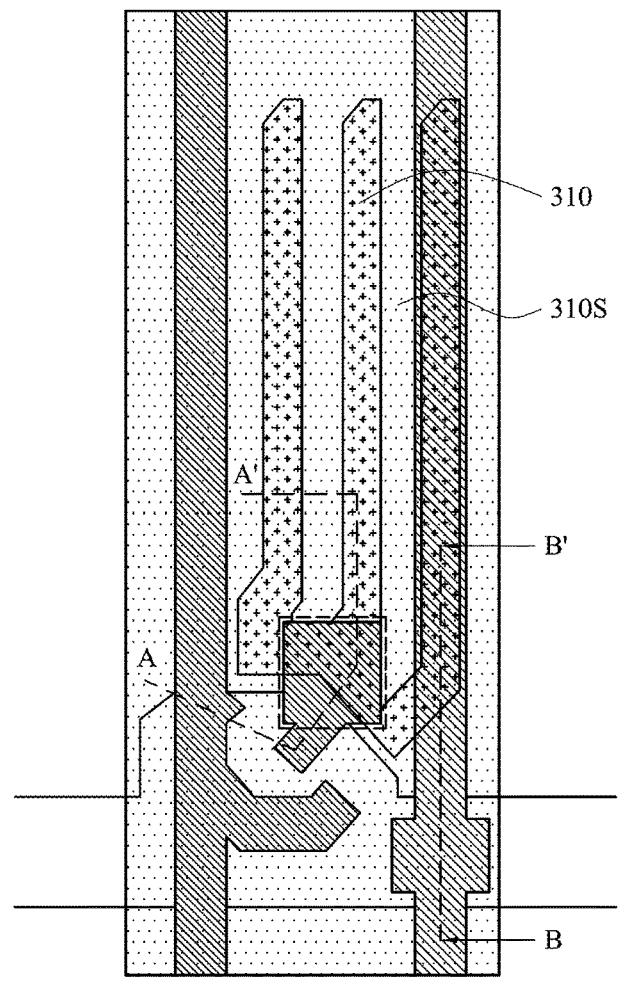
Figure 33B:
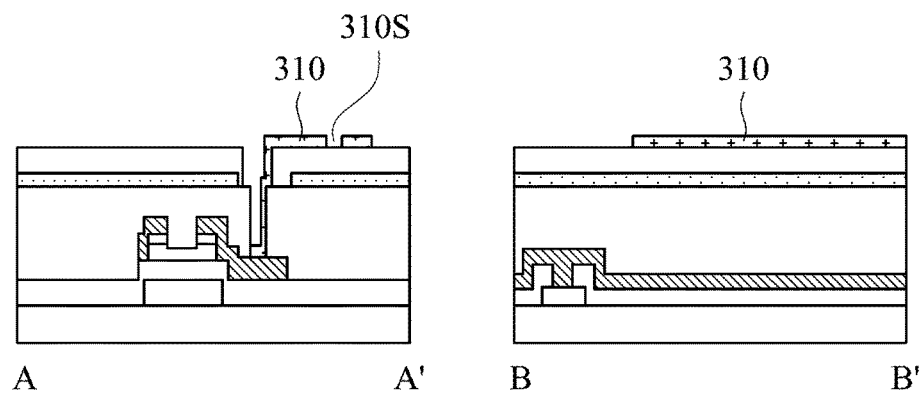

FIG. 26A-33A are top views illustrating intermediate stages of a method for manufacturing the display pane. FIG. 26B-33B are cross-sectional views illustrating intermediate stages of the method for manufacturing the display panel. FIG. 26B-33B are cross-sectional view of the pixel structure along cross-sectional lines AA' and BB' of FIG. 26A-33A respectively. Referring to 26A and FIG. 26B, a metal layer is formed on the substrate 401, and the first metal layer M1 is formed by a first photolithography process. The first metal layer M1 includes the gate 220G and the first signal line 141. Referring to FIG. 27A and FIG. 27B, the first insulation layer 402 is formed on the first metal layer M1. The semiconductor layers 202C and the ohmic contact layer 220O are formed on the first insulation layer 402. The formation of the semiconductor layer 202C and the ohmic contact layer 220O includes forming a semiconductor layer and an ohmic contact layer on the first insulation layer 402 first, and then the semiconductor layer 202C and the ohmic contact layer 220O are defined by a second photolithography process. Referring to 28A and FIG. 28B, a third photolithography process is performed to etch the first insulation layer 402 to form the via 402H in the first insulation layer 402. The via 402H exposes the first signal line 141. Referring to 29A and FIG. 29B, a metal layer is formed on the first insulation layer 402, and the second metal layer M2 is formed by a fourth photolithography process. The second metal layer M2 includes the source 220S, the drain 220D, the second signal line 142 and the third signal line 143. When etching the second metal layer M2, the ohmic contact layer 220O is also etched to form the ohmic contact layers 220O1 and 220O2 which are in contact with the source 220S and the drain 220D respectively. The third signal line 143 is electrically connected to the first signal line 141 through the via 402H. Referring to FIGS. 30A and 30B, the second insulation layer 403 is formed on the second metal layer M2, and a fifth photolithography process is performed to etch the second insulation layer 403 to form the opening 403H which exposes the drain 202D. Referring to FIG. 31A and FIG. 31B, a transparent conductive layer is formed on the first insulation layer 402, and a sixth photolithography process is performed to form the transparent conductive layer 405. The transparent conductive layer 405 includes the opening 405H which is corresponding to the opening 403H in the second insulation layer 403, and the size of the opening 405H is larger than that of the opening 403H. Referring to FIG. 32A and FIG. 32B, the third insulation layer 406 is formed on the transparent conductive layer 405, and a seventh photolithography process is performed to etch the third insulation layer 406 to form an opening 406H which is corresponding to the opening 403H in the second insulation layer 403. The size of the opening 406H is less than that of the opening 405H, that is to say, there is third insulation layer 406 located between sides of the opening 406H and the transparent conductive layer 405. Due to the size design of the openings 403H, 405H and 406H, the pixel electrode 310 formed in the opening 406H in a subsequent process is prevented from being shorted to the transparent conductive layer 405. The stacked opening 403H and opening 406H expose the drain 202D. Referring to FIG. 33A and FIG. 33B, a transparent conductive layer is formed on the third insulation layer 402, and an eighth photolithography process is performed to form the pixel electrode 310 having slits 310S. The pixel electrode 310 extends into the opening 403H and the opening 406H for electrically connecting to the drain 202D.

In the embodiments of FIG. 26A-33A, and FIG. 26B-33B, the first signal line 141 is gate line and is formed in the first metal layer, the second signal line 142 is data line and is formed in the second metal layer, and the third signal line 143 is formed in the second metal layer. Referring to FIG. 14 and FIG. 15 again, in the embodiments of FIG. 14 and FIG. 15, the first signal line 141 is data line and is formed in the second metal layer, the second signal line 142 is gate line and is formed in the first metal layer, and the third signal line 143 is formed in the first metal layer M1 in the display area 110. Therefore, in a method for manufacturing the display panel corresponding to the embodiments of FIG. 14 and FIG. 15, the first metal layer M1 formed by the first photolithography process includes the gate 220G, the second signal line 142 and the third signal line 143; the via 402H of the first insulation layer 402 formed by the third photolithography process exposes the third signal line 143; the second metal layer M2 formed by the fourth photolithography process includes the source 220S, the drain 220D and the first signal line 141, in which the first signal line 141 is electrically connected to the third signal line 143 through the via 402H; and the rest of the method is identical to the method for manufacturing the display panel described in FIG. 26B-33B, and therefore the description will not be repeated.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel having a display area and a non-display area, wherein the display panel comprises:
   a first substrate;
   a plurality of first signal lines, a plurality of second signal lines and a plurality of third signal lines disposed on a top surface of the first substrate, wherein the first signal lines respectively intersect with the second signal lines to define a plurality of pixel regions, and at least one of the pixel regions has one of the third signal lines disposed therein;
   a plurality of thin film transistors and a plurality of pixel electrodes disposed in the pixel regions, wherein each of the thin film transistors comprises a gate, a source and a drain which is electrically connected to one of the pixel electrodes; and
   at least one driving circuit,
   wherein the second signal lines and the third signal lines are electrically connected to the at least one driving circuit,
   wherein each of the first signal lines is electrically connected to one of the gate and the source of at least one of the thin film transistors,
   wherein each of the second signal lines is electrically connected to the other one of the gate and the source of at least one of the thin film transistors,
   wherein each of the third signal lines is electrically connected to one of the first signal lines,
   wherein the display panel further comprises a transparent conductive layer disposed between the third signal lines and the pixel electrodes, and the transparent conductive layer covers at least part of the third signal lines when viewed from a direction perpendicular to the top surface of the first substrate.

2. The display panel of claim 1, wherein the pixel regions are arranged as a plurality of columns and rows, and the columns comprises a first column, a second column and a third column which are arranged along a first direction,
   wherein one of the third signal lines extends through at least one pixel region in the first column, and
   wherein none of the third signal lines extends through the pixel regions in the second column and the third column.

3. The display panel of claim 1, wherein
   the first signal lines are gate lines and formed in a first metal layer;
   the second signal lines are data lines and formed in a second metal layer in the display area; and
   the third signal lines are formed in the second metal layer in the display area.

4. The display panel of claim 1, wherein the at least one driving circuit comprises a plurality of pads, the pads comprises a plurality of first pads and second pads, the first pads are electrically connected to the second signal lines, and the second pads are electrically connected to the third signal lines.

5. The display panel of claim 1, wherein the pixel regions are arranged as a plurality of columns and rows, and each of the third signal lines extends through at least one pixel region in one of the columns.

6. The display panel of claim 1, wherein the transparent conductive layer is a common electrode, and each of the pixel electrodes comprises a plurality of slits.

7. The display panel of claim 1, wherein the at least one driving circuit is disposed on the first substrate and in the non-display area.

8. The display panel of claim 1, wherein each of the first signal lines is electrically connected to at least two of the third signal lines.

9. The display panel of claim 1, wherein
   the first signal lines are data lines and formed in a second metal layer;
   the second signal lines are gate lines and formed in a first metal layer in the display area; and
   the third signal lines are formed in the first metal layer in the display area.

10. The display panel of claim 9, wherein an insulation layer is formed between the first and second metal layers, the insulation layer has a plurality of vias and each of the third signal lines is electrically connected to one of the first signal lines through at least one of the vias.

11. The display panel of claim 1, wherein the at least one driving circuit comprises a gate driving circuit and a source driving circuit.

12. The display panel of claim 11, wherein the pads are arranged as at least two rows.

13. The display panel of claim 1, wherein the display panel further comprises a second substrate and another transparent conductive layer,
   wherein the second substrate and the first substrate are disposed opposite to each other, and the another transparent conductive layer is disposed on the second substrate, and the another transparent conductive layer is a common electrode.

14. The display panel of claim 3, wherein one of the second signal lines and the third signal lines comprises a first part and a second part, the first part is formed in the second metal layer, the second part is formed in the first metal layer, and the display panel further comprises:
   a connection structure disposed in the non-display area for electrically connecting the first part and the second part, wherein the connection structure comprises:
   a first opening in a first insulation layer disposed on the first metal layer, wherein the first opening exposes the second part; and
   a second opening and a third opening in a second insulation layer disposed on the second metal layer, wherein the second opening is partially overlapped with the first opening, and the third opening exposes the first part,
   wherein a portion of the transparent conductive layer is overlapped with the second opening and the third opening, and connected to the first part and the second part.

15. The display panel of claim 3, wherein one of the second signal lines and the third signal lines comprises a first part and a second part, the first part is formed in the second metal layer, the second part is formed in the first metal layer, and the display panel further comprises:
   a connection structure disposed in the non-display area for electrically connecting the first part and the second part, wherein the connection structure comprises:
   an opening in a first insulation layer disposed on the first metal layer, wherein the opening exposes the second part, and the first part is electrically connected to the second part through the opening.

16. The display panel of claim 3, wherein an insulation layer is formed between the first and second metal layers, the insulation layer has a plurality of vias, and each of the third signal lines is electrically connected to one of the first signal lines through at least one of the vias.

* * * * *